US012690254B2

(12) United States Patent
Radulescu et al.

(10) Patent No.: US 12,690,254 B2
(45) Date of Patent: Jul. 21, 2026

(54) METAL PILLAR CONNECTION TOPOLOGIES FOR HETEROGENEOUS PACKAGING

(71) Applicant: MACOM Technology Solutions Holdings, Inc., Lowell, MA (US)

(72) Inventors: Fabian Radulescu, Chapel Hill, NC (US); Basim Noori, San Jose, CA (US); Scott Sheppard, Chapel Hill, NC (US); Kwangmo Chris Lim, San Jose, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 174 days.

(21) Appl. No.: 17/466,783

(22) Filed: Sep. 3, 2021

(65) Prior Publication Data
US 2023/0075505 A1     Mar. 9, 2023

(51) Int. Cl.
H10D 64/23          (2025.01)
H10D 64/27          (2025.01)
(Continued)

(52) U.S. Cl.
CPC ......... H10D 64/257 (2025.01); H10D 64/519 (2025.01); H10W 20/20 (2026.01); H10W 72/248 (2026.01)

(58) Field of Classification Search
CPC . H01L 24/14; H01L 23/481; H01L 29/41758; H01L 29/4238; H01L 2224/14152; H01L 2224/14153; H01L 2224/1416; H01L 2224/14163; H01L 2924/10272; H01L 2924/1033; H01L 2924/1421; H01L 2924/3025; H01L 24/13;
(Continued)

(56) References Cited

U.S. PATENT DOCUMENTS 4,946,547  A     8/1990  Palmour et al.
5,192,987  A     3/1993  Khan et al.
(Continued)

FOREIGN PATENT DOCUMENTS

EP          3982406 A2     4/2022
EP          3993026 A2     5/2022
(Continued)

OTHER PUBLICATIONS

Notification of Transmittal of the International Search Report and the Written Opinion of the International Searching Authority, or the Declaration, in corresponding PCT Application No. PCT/US2022/075631 (Jan. 27, 2023).

*Primary Examiner* — Duy T Nguyen
(74) *Attorney, Agent, or Firm* — Myers Bigel, P.A.

(57)          ABSTRACT
A radio frequency ("RF") transistor amplifier die includes a semiconductor layer structure having a plurality of transistor cells, and an insulating layer on a surface of the semiconductor layer structure. Conductive pillar structures protrude from the insulating layer opposite the surface of the semiconductor layer structure, and are configured to provide input signal, output signal, or ground connections to the transistor cells. The ground connections are arranged between the input and/or output signal connections to the transistor cells. Related devices and packages are also discussed.

27 Claims, 18 Drawing Sheets

(51) Int. Cl.
  *H10W 20/20*     (2026.01)
  *H10W 72/20*     (2026.01)

(58) Field of Classification Search
  CPC ..... H01L 2223/6655; H01L 2224/0401; H01L
           2224/05644; H01L 2224/05647; H01L
           2224/06102; H01L 2224/13082; H01L
           23/04; H01L 23/142; H01L 23/08; H01L
           29/2003; H01L 29/7786; H01L
           2224/05657; H01L 2224/13147; H01L
           2224/141; H01L 2224/16227; H01L
           23/057; H01L 23/36; H01L 23/4334;
           H01L 23/49531; H01L 23/66; H01L
           23/3121; H01L 23/4824; H10D 64/257;
           H10D 64/519; H10D 64/254; H10D
                       30/475; H10D 62/8503
  USPC ......................................................... 257/253
  See application file for complete search history.

(56)              References Cited

U.S. PATENT DOCUMENTS

| | | | |
|---|---|---|---|
| 5,200,022 | A | 4/1993 | Kong et al. |
| 5,210,051 | A | 5/1993 | Carter |
| 5,296,395 | A | 3/1994 | Khan et al. |
| 5,309,112 | A * | 5/1994 | Lee ........................ H03K 5/249 |
| | | | 327/552 |
| RE34,861 | E | 2/1995 | Davis et al. |
| 5,393,993 | A | 2/1995 | Edmond et al. |
| 5,523,589 | A | 6/1996 | Edmond et al. |
| 5,789,791 | A * | 8/1998 | Bergemont ......... H01L 23/4824 |
| | | | 257/920 |
| 6,081,006 | A * | 6/2000 | Nelson .............. H01L 29/41725 |
| | | | 257/E29.127 |
| 6,218,680 | B1 | 4/2001 | Carter et al. |
| 6,316,793 | B1 | 11/2001 | Sheppard et al. |
| 6,404,030 | B1 * | 6/2002 | Ma .................... H01L 29/41758 |
| | | | 257/E29.12 |
| 6,463,267 | B1 * | 10/2002 | Akamine ................ H01L 23/66 |
| | | | 455/259 |

| | | | |
|---|---|---|---|
| 6,548,333 | B2 | 4/2003 | Smith |
| 6,825,559 | B2 | 11/2004 | Mishra et al. |
| 7,030,428 | B2 | 4/2006 | Saxler |
| 7,045,404 | B2 | 5/2006 | Sheppard et al. |
| 7,544,963 | B2 | 6/2009 | Saxler |
| 7,548,112 | B2 | 6/2009 | Sheppard |
| 7,592,211 | B2 | 9/2009 | Sheppard et al. |
| 7,615,774 | B2 | 11/2009 | Saxler |
| 7,709,269 | B2 | 5/2010 | Smith et al. |
| 8,049,252 | B2 | 11/2011 | Smith et al. |
| 8,120,064 | B2 | 2/2012 | Parikh et al. |
| 8,563,372 | B2 | 10/2013 | Hagleitner et al. |
| 8,674,415 | B2 * | 3/2014 | Sugiura ................ H10D 64/257 |
| | | | 257/341 |
| 8,912,647 | B2 * | 12/2014 | Takagi .................. H01L 23/047 |
| | | | 257/728 |
| 9,214,352 | B2 | 12/2015 | Hagleitner et al. |
| 10,224,285 | B2 | 3/2019 | Laroche et al. |
| 10,763,334 | B2 | 9/2020 | Trang et al. |
| 2003/0183928 | A1 * | 10/2003 | Miyazawa ............ H01L 23/481 |
| | | | 257/E23.079 |
| 2012/0086497 | A1 * | 4/2012 | Vorhaus .................. H03F 3/604 |
| | | | 257/E29.089 |
| 2013/0020646 | A1 * | 1/2013 | Deval .................... H01L 29/861 |
| | | | 257/E27.017 |
| 2013/0106519 | A1 | 5/2013 | Kamiyama et al. |
| 2014/0002188 | A1 * | 1/2014 | Chen ......................... H03F 3/19 |
| | | | 330/250 |
| 2015/0279781 | A1 * | 10/2015 | Kaibara .............. H10W 20/435 |
| | | | 257/775 |
| 2017/0271258 | A1 * | 9/2017 | Wood .................. H01L 23/5283 |
| 2019/0123166 | A1 * | 4/2019 | Kanawati .............. H01L 23/535 |
| 2021/0098403 | A1 * | 4/2021 | Kondo .................... H03F 3/195 |
| 2021/0375856 | A1 * | 12/2021 | Alcorn .............. H01L 21/8258 |
| 2022/0115297 | A1 * | 4/2022 | Shilmkar .............. H01L 23/552 |
| 2022/0406687 | A1 * | 12/2022 | Hill ......................... G01R 27/02 |

FOREIGN PATENT DOCUMENTS

| | | |
|---|---|---|
| JP | 2006512775 A | 4/2006 |
| JP | 2020508573 A | 3/2020 |
| JP | 2021530868 A | 11/2021 |

* cited by examiner

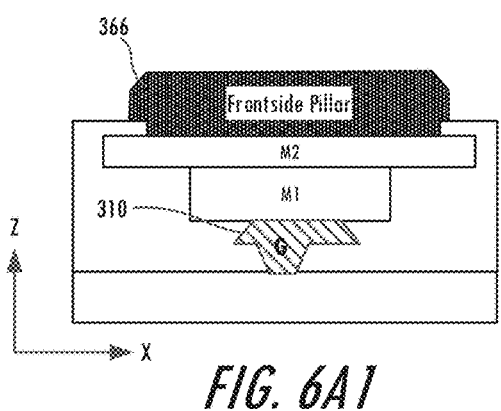
*FIG. 6A1*
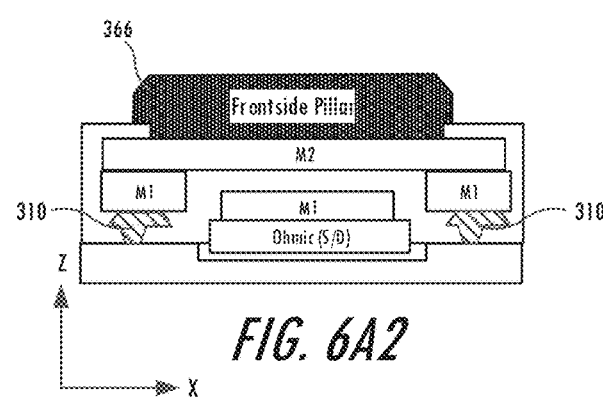
*FIG. 6A2*
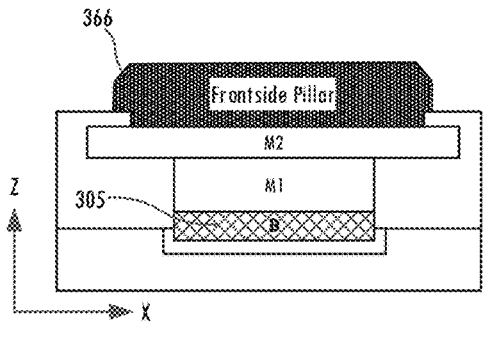
*FIG. 6B1*
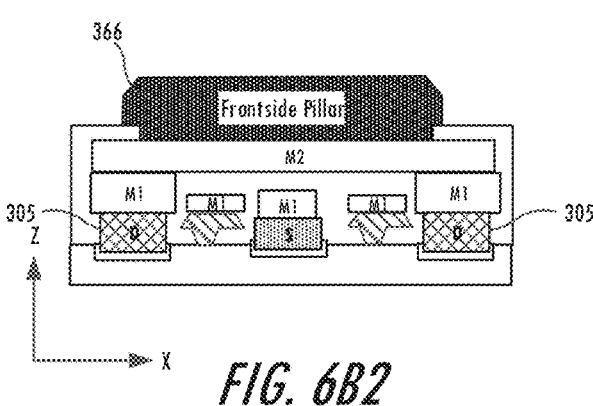
*FIG. 6B2*
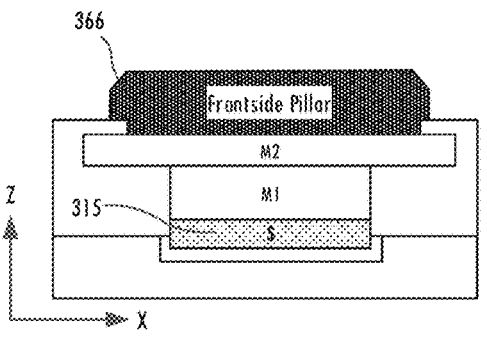
*FIG. 6C1*
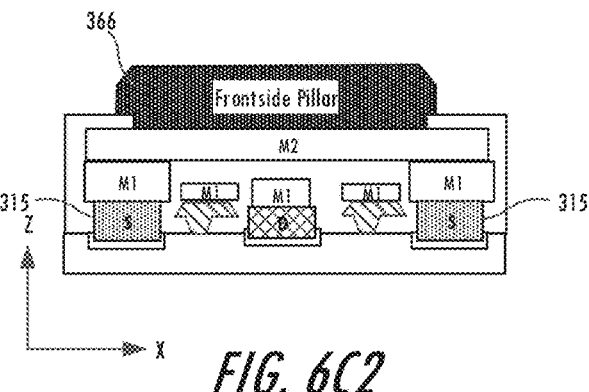
*FIG. 6C2*

METAL PILLAR CONNECTION TOPOLOGIES FOR HETEROGENEOUS PACKAGING

FIELD

The present disclosure is directed to integrated circuit ("IC") devices, and more particularly, to power amplifier devices, device packaging, and related fabrication methods.

BACKGROUND

Electrical circuits requiring high power handling capability while operating at high frequencies, such as 0.5-1 GHZ, 3 GHZ, and 10 GHz or more, have in recent years become more prevalent. In particular, there is now a high demand for radio frequency ("RF") power amplifiers that are used to amplify RF signals at radio (including microwave) frequencies in a variety of applications, such as base stations for wireless communication systems, etc. The signals amplified by the RF power amplifiers often include signals that have a modulated carrier having frequencies in the megahertz (MHz) to gigahertz (GHz) range. These RF power amplifiers may need to exhibit high reliability, good linearity, and handle high output power levels.

Many RF power amplifier designs utilize semiconductor switching devices as amplification devices. Examples of these switching devices include power transistor devices, such as field effect transistor (FET) devices including MOS-FETs (metal-oxide semiconductor field-effect transistors), DMOS (double-diffused metal-oxide semiconductor) transistors, HEMTs (high electron mobility transistors), MES-FETs (metal-semiconductor field-effect transistors), LDMOS (laterally-diffused metal-oxide semiconductor) transistors, etc.

RF transistor amplifiers are typically formed as semiconductor integrated circuit chips. Most RF transistor amplifiers are implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistor structures are arranged electrically in parallel. An RF transistor amplifier may be implemented by transistor cells of a single integrated circuit chip or "die," or may include a plurality of dies. A die or chip may refer to a small block of semiconducting material or other substrate on which electronic circuit elements are fabricated. When multiple RF transistor amplifier dies are used, they may be connected in series and/or in parallel.

Silicon-based RF transistor amplifiers are typically implemented using LDMOS transistors, and can exhibit high levels of linearity with relatively inexpensive fabrication. Group III nitride-based RF amplifiers are typically implemented using HEMTs, primarily in applications requiring high power and/or high frequency operation where LDMOS transistor amplifiers may have inherent performance limitations.

In operation of HEMT devices, a two-dimensional electron gas (2DEG) is formed at the heterojunction of two semiconductor materials with different bandgap energies, where the smaller bandgap material has a higher electron affinity. The 2DEG is an accumulation layer in the smaller bandgap material and can contain a very high sheet electron concentration. Additionally, electrons that originate in the wider-bandgap semiconductor material transfer to the 2DEG layer, allowing high electron mobility due to reduced ionized impurity scattering. This combination of high carrier concentration and high carrier mobility can give the HEMT a very large transconductance and may provide a strong performance advantage over metal oxide semiconductor field effect transistors (MOSFETs) for high-frequency applications. High electron mobility transistors fabricated in Group III-nitride based material systems also have the potential to generate large amounts of radio frequency (RF) power because of the combination of material characteristics that includes the aforementioned high breakdown fields, wide bandgaps, large conduction band offset, and/or high saturated electron drift velocity.

RF transistor amplifiers often include matching circuits or circuitry, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation, such as second and third order harmonic products. The termination of the harmonic products also influences generation of intermodulation distortion products.

The transistor die(s) as well as the impedance matching and harmonic termination circuits may be enclosed in a device package. Integrated circuit packaging may refer to encapsulating one or more dies in a supporting case or package that protects the dies from physical damage and/or corrosion, and supports the electrical contacts for connection to external circuits. Electrical leads may extend from the package to electrically connect the transistor die to external systems and/or circuit elements such as input and output RF transmission lines and bias voltage sources. The input and output matching circuitry in an integrated circuit device package typically include LC networks that provide at least a portion of an impedance matching circuit that is configured to match the impedance of the active transistor die to a fixed value. Typically, the input and output RF matching circuitry employ off-die components and implementations, which may increase the package footprint.

Connections within the packages, such as between the die and the off-die components or other outside circuitry, may rely on wire bonds. The wire bonds may be formed through a die level process step. The geometry of such conventional connections may be difficult to control and/or may limit precision for more complex RF IC designs. Also, signal routing options through wire bonds may be limited due to relative bulk and larger die area requirements for the wire-bond contact pads.

SUMMARY

According to some embodiments, an integrated circuit device includes a radio frequency ("RF") transistor amplifier die comprising a semiconductor layer structure including a plurality of transistor cells; an insulating layer on a surface of the semiconductor layer structure; and a plurality of conductive pillar structures that protrude from the insulating layer opposite the surface of the semiconductor layer structure. Respective ones of the conductive pillar structures are configured to provide input signal, output signal, or ground connections to the transistor cells. The ground connections are arranged between the input and/or output signal connections to the transistor cells.

In some embodiments, a first subset of the conductive pillar structures may be configured to provide the ground connections, and may be arranged between second third subsets of the conductive pillar structures that may be configured to provide the input signal and output signal connections, respectively.

In some embodiments, a first subset of the conductive pillar structures may be configured to provide the ground connections, a second subset of the conductive pillar structures may be configured to provide one of the input or the output signal connections, and respective conductive pillar structures of the second subset may be arranged between respective conductive pillar structures of the first subset.

In some embodiments, a third subset of the conductive pillar structures may be configured to provide another of the input or the output signal connections, and respective conductive pillar structures of the third subset may be arranged between respective conductive pillar structures of the first subset.

In some embodiments, the transistor cells may comprise gate, drain, and source fingers extending on the semiconductor layer structure. The respective conductive pillar structures of the first subset may be coupled to the source fingers, and the respective conductive pillar structures of the second subset may be coupled to the gate fingers or to the drain fingers.

In some embodiments, the respective conductive pillar structures of the first subset may be between opposing ends of the source fingers, and/or the respective conductive pillar structures of the second subset may be between opposing ends of the gate or drain fingers.

In some embodiments, the respective conductive pillar structures of the first subset may be coupled to respective extension regions of the source fingers, and/or the respective conductive pillar structures of the second subset may be coupled to respective extension regions of the gate or drain fingers.

In some embodiments, the gate, drain, and/or source fingers respectively may comprise finger segments that are spaced apart from each other, and the respective extension regions may be arranged between the finger segments.

In some embodiments, the transistor cells comprise gate, drain, and source fingers extending on the semiconductor layer structure, and wherein the input signal, output signal, or ground connections provided by the respective ones of the conductive pillar structures are free of wirebond connection pads that electrically connect to the gate fingers, the drain fingers, or the source fingers.

In some embodiments, at least one of the conductive pillar structures may be coupled to multiple of the gate fingers, multiple of the drain fingers, or multiple of the source fingers by one or more intervening metal layers therebetween.

In some embodiments, the conductive pillar structures may protrude from the insulating layer to adjacent a top of the RF transistor amplifier die. A substrate may be provided on the semiconductor layer structure opposite the surface having the insulating layer thereon, and conductive via structures may extend through the substrate to adjacent a bottom of the RF transistor amplifier die. Respective ones of the conductive via structures may be configured to provide other input signal, output signal, or ground connections to the transistor cells.

In some embodiments, the respective ones of the conductive pillar structures may be arranged within an active region comprising the transistor cells to provide the input signal, output signal, and ground connections.

In some embodiments, the transistor cells may comprise gate fingers extending along the surface of the semiconductor layer structure, and the input signal connections may be arranged between opposing ends of the gate fingers.

According to some embodiments, a radio frequency ("RF") transistor amplifier die comprises a semiconductor layer structure including a plurality of transistor cells; an insulating layer on a surface of the semiconductor layer structure; and a plurality of conductive pillar structures that protrude from the insulating layer opposite the surface of the semiconductor layer structure. Respective ones of the conductive pillar structures are configured to provide input signal, output signal, or ground connections to the transistor cells. The transistor cells comprise gate fingers extending on the semiconductor layer structure, and the input signal connections are coupled to the gate fingers between opposing ends thereof.

In some embodiments, the ground connections may be arranged between the input and output signal connections to the transistor cells.

In some embodiments, a first subset of the conductive pillar structures may be configured to provide the input signal connections, a second subset of the conductive pillar structures may be configured to provide the ground connections, and respective conductive pillar structures of the first subset may be arranged between respective conductive pillar structures of the second subset.

In some embodiments, a third subset of the conductive pillar structures may be configured to provide the output signal connections, and respective conductive pillar structures of the third subset are arranged between respective conductive pillar structures of the second subset.

In some embodiments, the transistor cells may further comprise source and drain fingers extending on the semiconductor layer structure. The respective conductive pillar structures of the second subset may be between opposing ends of the source fingers, and/or the respective conductive pillar structures of the third subset may be between opposing ends of the drain fingers.

In some embodiments, the respective conductive pillar structures of the first, second, and/or third subsets may be coupled to respective extension regions between finger segments of the gate, source, and/or drain fingers, respectively.

In some embodiments, the conductive pillar structures may protrude from the insulating layer adjacent to a top of the RF transistor amplifier die. A substrate may be provided on the semiconductor layer structure opposite the surface having the insulating layer thereon, and conductive via structures may extend through the substrate to adjacent a bottom of the RF transistor amplifier die. Respective ones of the conductive via structures may be configured to provide other input signal, output signal, or ground connections to the transistor cells.

In some embodiments, the respective ones of the conductive pillar structures may be arranged within an active region comprising the transistor cells to provide the input signal, output signal, and ground connections.

In some embodiments, the transistor cells may further comprise drain fingers and source fingers extending on the semiconductor layer structure, and the input signal, output signal, or ground connections provided by the respective ones of the conductive pillar structures may be free of wirebond connection pads that electrically connect to the gate fingers, the drain fingers, or the source fingers.

According to some embodiments, a radio frequency ("RF") transistor amplifier die comprises a semiconductor layer structure including a plurality of transistor cells adjacent a surface thereof; and a plurality of conductive pillar structures that protrude away from the surface of the semiconductor layer structure. Respective ones of the conductive pillar structures are configured to provide input signal, output signal, or ground connections to the transistor cells. The transistor cells comprise gate, drain, and source fingers extending on the semiconductor layer structure. The input signal, output signal, or ground connections provided by the respective ones of the conductive pillar structures are free of wirebond connection pads that electrically connect to the gate fingers, the drain fingers, or the source fingers.

In some embodiments, the conductive pillar structures may include a first subset coupled to the source fingers between opposing ends thereof, a second subset coupled to the gate fingers between opposing ends thereof, and/or a third subset coupled to the drain fingers between opposing ends thereof.

In some embodiments, the ground connections may be arranged between the input and/or output signal connections.

In some embodiments, a first subset of the conductive pillar structures may be configured to provide the ground connections, and may be arranged between second third subsets of the conductive pillar structures that may be configured to provide the input signal and output signal connections, respectively.

In some embodiments, a first subset of the conductive pillar structures may be configured to provide the ground connections, a second subset of the conductive pillar structures is configured to provide one of the input or the output signal connections, and respective conductive pillar structures of the second subset may be arranged between respective conductive pillar structures of the first subset.

In some embodiments, the respective conductive pillar structures of the first subset may be coupled to respective extension regions of the source fingers, and/or the respective conductive pillar structures of the second subset may be coupled to respective extension regions of the gate or drain fingers.

In some embodiments, the gate, drain, and/or source fingers may respectively comprise finger segments that are spaced apart from each other, and the respective extension regions may be arranged between the finger segments.

In some embodiments, at least one of the conductive pillar structures may be coupled to multiple of the gate fingers, multiple of the drain fingers, or multiple of the source fingers by one or more intervening metal layers therebetween.

In some embodiments, an insulating layer may extend on the surface of the semiconductor layer structure adjacent a top of the RF transistor amplifier die, and the conductive pillar structures may protrude from the insulating layer. A substrate may be provided on the semiconductor layer structure opposite the surface having the insulating layer thereon. Conductive via structures may extend through the substrate to adjacent a bottom of the RF transistor amplifier die. Respective ones of the conductive via structures may be configured to provide other input signal, output signal, or ground connections to the transistor cells.

In some embodiments, the respective ones of the conductive pillar structures may be arranged within an active region comprising the transistor cells to provide the input signal, output signal, and ground connections.

According to some embodiments, an integrated circuit device package includes a radio frequency ("RF") transistor amplifier die comprising a semiconductor layer structure including a plurality of transistor cells, an insulating layer on a surface of the semiconductor layer structure, and a plurality of conductive pillar structures that protrude from the insulating layer opposite the surface of the semiconductor layer structure. The integrated circuit device package further includes a package substrate comprising conductive connection patterns corresponding to an arrangement of the conductive pillar structures, where respective ones of the conductive pillar structures attach the RF transistor amplifier die to the conductive connection patterns of the package substrate, and are configured to provide input signal, output signal, or ground connections to the transistor cells. The ground connections are arranged between the input and/or output signal connections. Additionally or alternatively, the input signal connections are arranged between opposing ends of gate fingers of the transistor cells.

In some embodiments, the conductive pillar structures may protrude from the insulating layer adjacent to a top of the RF transistor amplifier die, and a substrate may be provided on the semiconductor layer structure opposite the surface having the insulating layer thereon. Conductive via structures may extend through the substrate to adjacent a bottom of the RF transistor amplifier die. Respective ones of the conductive via structures are configured to provide other input signal, output signal, or ground connections to the transistor cells.

In some embodiments, the input signal, output signal, or ground connections provided by the respective ones of the conductive pillar structures may be free of wirebond connection pads that electrically connect to the gate fingers, drain fingers, or source fingers of the transistor cells.

In some embodiments, a first subset of the conductive pillar structures may be configured to provide the ground connections, and may be arranged between second third subsets of the conductive pillar structures that may be configured to provide the input signal and output signal connections, respectively.

In some embodiments, a first subset of the conductive pillar structures may be configured to provide the ground connections, a second subset of the conductive pillar structures may be configured to provide one of the input or the output signal connections, and respective conductive pillar structures of the second subset may be arranged between respective conductive pillar structures of the first subset.

In some embodiments, a third subset of the conductive pillar structures may be coupled to another of the input or the output signal connections, and respective conductive pillar structures of the third subset may be arranged between respective conductive pillar structures of the first subset.

In some embodiments, the respective ones of the conductive pillar structures may be arranged within an active region comprising the transistor cells to provide the input signal, output signal, and ground connections.

In some embodiments, the semiconductor layer structure may include one or more epitaxial layers of a wide bandgap semiconductor material.

In some embodiments, the semiconductor layer structure may include a Group-III nitride material on a silicon carbide substrate.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 6A1, 6A2, 6B1, 6B2, 6C1, and 6C2 are cross-sectional views of frontside pillar connection structures in branched configurations according to some embodiments of the present disclosure.

DETAILED DESCRIPTION OF EMBODIMENTS

Figure 1:
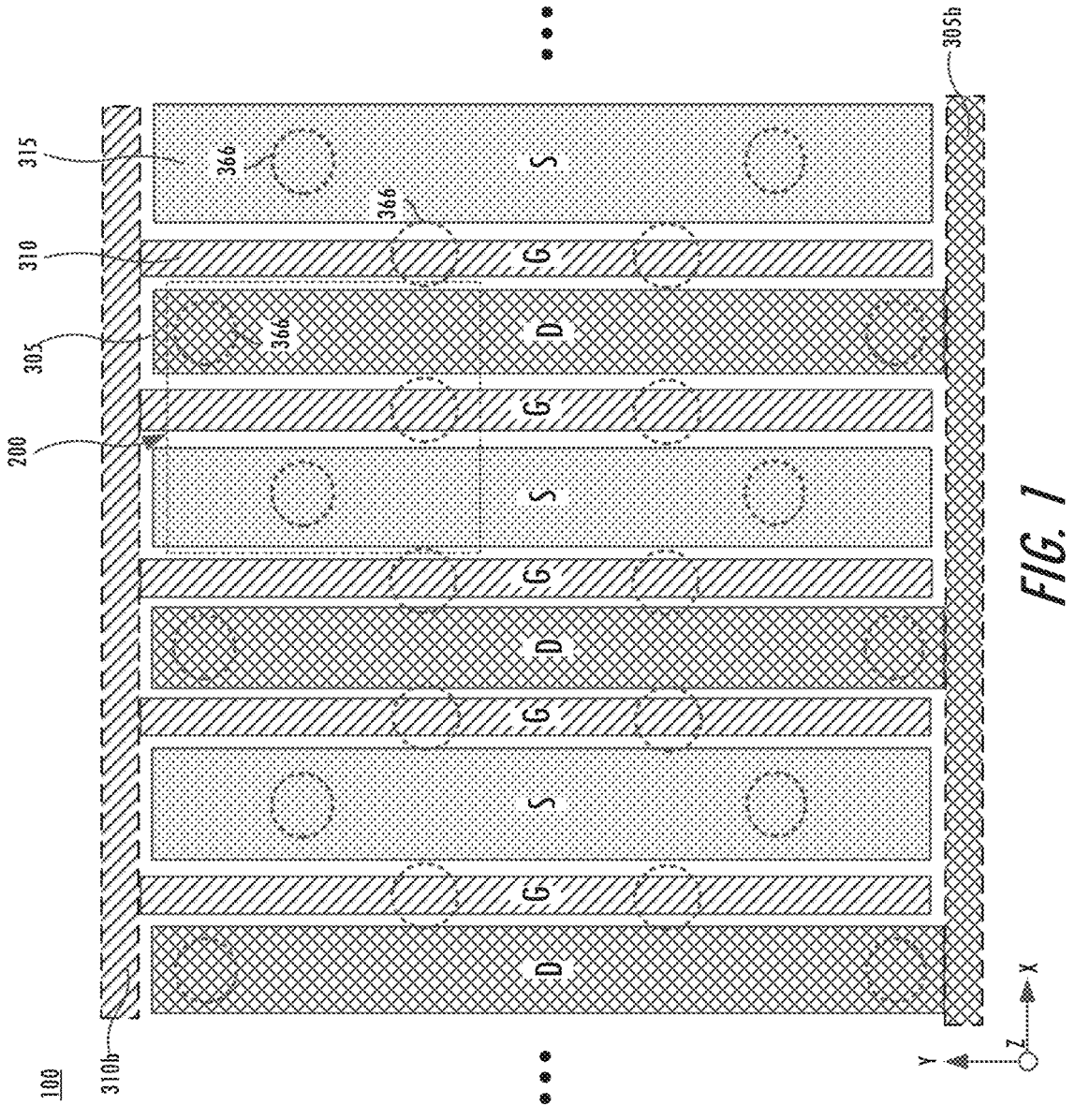
FIG. 1 is a schematic plan view of a RF transistor amplifier die or device according to some embodiments of the present disclosure.

Embodiments of the present disclosure are directed to devices and fabrication methods that can reduce or eliminate some disadvantages associated with wire bonds in integrated circuit device packages. For example, wire bonds may impose limitations on package size, signal routing, and assembly, due to bulk of the wires and contact pad area requirements. In addition, wire bonds may introduce undesired series inductance that can reduce or negate the effectiveness of matching circuits (including input/output impedance matching and/or harmonic termination circuits), particularly in higher frequency RF applications.

Some embodiments of the present disclosure provide integrated devices and fabrication methods that use electrical connection structures on the frontside or front surface of an RF transistor amplifier die or device, such as conductive pillar structures (also referred to herein as frontside pillar connection structures, frontside pillar structures, or frontside pillars), alone or in combination with conductive via structures (also referred to herein as through substrate vias or backside vias) that provide backside connections or contacts, thereby reducing or eliminating wire bond connections in the package. As used herein, the "frontside" or "front surface" of a die or device may be adjacent the active transistor cells in the semiconductor layer structure of the device, while the "backside" or "back surface" of the die or device may be opposite the frontside (and in some embodiments may include the substrate on which the semiconductor layer structure is formed or otherwise provided).

The frontside pillars may be conductive structures (including metal-plated or other metal structures) that can be integrated on-wafer (i.e., using wafer level processing), and can improve control over geometry with design flexibility for connecting the transistor die to the package, for example, using any combination of frontside pillars and backside connections where at least one of the input, output, or ground connections is provided by the frontside pillars. The frontside pillars may be fabricated using high resolution patterning methods, e.g., stepper lithography. Defining the frontside pillar structures through lithography steps can allow for more effective connection methods that may be used in highly integrated packaging systems, e.g. heterogenous, system on package (SOP), 3D stacking, etc. In particular, a device including frontside pillars as described herein can be "flipped" with the frontside pillars facing down, such that the frontside pillars can connect one or more terminals of the device (e.g., the source, drain, and/or gate terminals of a transistor die) to a printed circuit board (PCB), redistribution layer (RDL) structure, and/or other package substrate, including thermally enhanced packages (e.g., a TEPAC or T3PAC package), for external connections (e.g., input, output, and/or ground connections, also referred to as "off-chip" connections).

The frontside pillars can also be arranged to provide different routing of the off-chip connections, including the input and output signal routing on and off the transistor die. In particular, embodiments of the present invention described herein provide methods and topologies including frontside pillars that can improve or optimize the input/output RF signal integrity, packaging complexity, and transistor die design. Some embodiments may consider design trade-offs regarding input and output signal routing in relationship to the transistor die surface (front and back), placement of the ground contacts for proper or desired transistor functioning, and signal integrity. For example, all three FET terminals (gate, drain, and source) may be routed to the same side of the die (e.g., the frontside) to provide input, output, and ground connections in some embodiments, while other embodiments may include various combinations of frontside pillars and backside connections. In RF IC designs that may require a backside ground plane, conductive through substrate vias may be used for the ground connections (e.g., for connection to the FET source terminals). If multiple types of connections (e.g., both output and ground connections) are routed to the backside, a backside metal patterning step may be used to provide electrical isolation between the connection pads for the respective types of connects. In some embodiments, the frontside pillar connections may eliminate the need for backside via connections.

FIG. 1 is a schematic plan view of a portion of a semiconductor die 100 according to embodiments of the present disclosure. The die 100 may include transistor cells of a power transistor device, for example, an RF power amplifier. FIGS. 2A-2D are schematic cross-sectional views of unit cell transistor structures 200a-200d (collectively 200; also referred to herein as a transistor structures or transistor cells) of the device or die 100. The plan view of FIG. 1 is taken along line I-I' of FIGS. 2A-2D.

As shown in FIGS. 1 and 2A-2D, a semiconductor layer structure 390, such as a semiconductor structure for a Group III nitride or other wide bandgap semiconductor HEMT or MOSFET, may be formed on a substrate 322 such as a silicon carbide substrate or a sapphire substrate. The substrate 322 may be a semi-insulating silicon carbide substrate that may be, for example, the 4H polytype of silicon carbide. Other silicon carbide candidate polytypes may include the 3C, 6H, and 15R polytypes. The substrate 322 may be a High Purity Semi-Insulating (HPSI) substrate, available from Cree, Inc. The term 'semi-insulating' is used descriptively herein, rather than in an absolute sense.

In some embodiments of the present disclosure, the silicon carbide bulk crystal of the substrate 322 may have a resistivity equal to or higher than about $1\times10^5$ ohm-cm at room temperature. Methods for producing such SiC substrates are described, for example, in U.S. Pat. No. Re. 34,861, U.S. Pat. Nos. 4,946,547, 5,200,022, and 6,218,680, the disclosures of which are incorporated by reference herein in their entireties. It is to be understood that, although silicon carbide may be employed as a substrate 322, embodiments of the present disclosure may utilize any suitable substrate for the substrate 322, such as sapphire (Al$_2$O$_3$), aluminum nitride (AlN), aluminum gallium nitride (Al-GaN), gallium nitride (GaN), silicon (Si), GaAs, LGO, zinc oxide (ZnO), LAO, indium phosphide (InP), and the like.

The substrate 322 may be a silicon carbide wafer, and the device 100 may be formed, at least in part, via wafer level processing, and the wafer may then be diced to provide a device 100 including plurality of individual unit cell transistors (respectively designated herein as 200). In some embodiments, the thickness of the substrate 322 (e.g., in a vertical or Z direction in FIGS. 2A-2D) may be greater than 100 μm, greater than 200 μm, or greater than 400 μm. In some embodiments, the transistor structure 200 may include a thinned substrate 322. In some embodiments, the substrate 322 may be thinned to a thickness (e.g., in the vertical or Z direction) of about 100 μm or less, e.g., 75 μm or less or 50 μm or less.

The semiconductor layer structure 390 is formed on a surface of the substrate 322 (or on the optional layers described further herein). In the illustrated examples, the semiconductor layer structure 390 is a wide bandgap semiconductor material formed by epitaxial growth, and thus includes one or more epitaxial layers 324. Techniques for epitaxial growth of Group III nitrides have been described in, for example, U.S. Pat. Nos. 5,210,051, 5,393,993, and 5,523,589, the disclosures of which are also incorporated by reference herein in their entireties. While semiconductor layer structure 390 is shown with reference to one or more epitaxial layers 324 for purposes of illustration, semiconductor layer structure 390 may include additional layers/structures/elements such as a buffer and/or nucleation layer(s) on or between substrate 322 and the one or more epitaxial layers 324, and/or a cap layer on an upper surface 324A of the epitaxial layer 324. For example, an AlN buffer layer may be formed on the upper surface 322A of the substrate 322 to provide an appropriate crystal structure transition between the silicon carbide substrate 322 and the remainder of the layers of the transistor structure 200. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by metal-organic chemical vapor deposition (MOCVD), molecular beam epitaxy (MBE), and/or hydride vapor phase epitaxy (HVPE).

Still referring to FIGS. 1 and 2A-2D, at the frontside 100f of the die 100, a source contact 315 and a drain contact 305 may be formed on a surface 324A of the epitaxial layer 324 and may be laterally spaced apart from each other. The source region of the unit cell transistor 200 is the portion of the semiconductor layer structure 390 that is directly underneath the source contact 315, and the drain region of the unit cell transistor 200 is the portion of the semiconductor layer structure 390 that is directly underneath the drain contact 305. A gate contact 310 may be formed on the epitaxial layer 324 between the source contact 315 and the drain contact 305. The material of the gate contact 310 may be chosen based on the composition of the epitaxial layer 324, and may, in some embodiments, be a Schottky contact. Some materials capable of making a Schottky contact to a Group III nitride based semiconductor material may be used, such as, for example, nickel (Ni), platinum (Pt), nickel silicide (NiSi$_x$), copper (Cu), palladium (Pd), chromium (Cr), tungsten (W) and/or tungsten silicon nitride (WSiN). The gate, drain, and source contacts 310, 305, and 315 may provide gate, drain, and source terminals of each unit cell transistor 200, respectively.

The source contact 315 and/or the drain contact 305 may include a metal that can form an ohmic contact to a Group III nitride based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), NiSi$_x$, titanium silicide (TiSi), titanium nitride (TiN), WSiN, Pt and the like. Thus, the source contact 315 and/or the drain contact 305 may contain an ohmic contact portion in direct contact with the epitaxial layer 324 (e.g., the barrier layer in a HEMT device). In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

In some embodiments, the transistor cell 200 may be a HEMT structure, and the epitaxial layer structure 324 may include a channel layer formed on a surface 322A of the substrate 322 and a barrier layer formed on a surface of the channel layer. The channel layer may have a bandgap that is less than the bandgap of the barrier layer and the channel layer may also have a larger electron affinity than the barrier layer. The channel layer and the barrier layer may include Group III-nitride based materials. As discussed above with respect to the conventional HEMT device, a 2DEG layer is induced in the channel layer at a junction between the channel layer and the barrier layer. The 2DEG layer acts as a highly conductive layer that allows conduction between the source and drain regions of the device that are beneath the source contact 315 and the drain contact 305, respectively. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference.

As will be understood by one of ordinary skill in the art, the transistor cell 200 (e.g., a HEMT, MOSFET, LDMOS, etc.) may be defined by the active region between the source contact 315 and the drain contact 305 under the control of a gate contact 310. In some embodiments, the source contact 315, the drain contact 305, and the gate contact 310 may be formed as a plurality of source contacts 315, drain contacts 305, and gate contacts 310 alternately arranged on the epitaxial layer 324, with a gate contact 310 disposed between adjacent drain contacts 305 and source contacts 315 to form a plurality of transistor unit cells 200, as illustrated in FIG. 1. Hundreds or thousands of unit cells, such as unit cell 200, may be formed on the semiconductor substrate and may be electrically connected in parallel to provide the RF transistor amplifier die or device 100.

In the examples of FIGS. 1 and 2A-2D, the die 100 may include multiple transistor cells 200, with respective contacts connected in parallel to provide the off-chip connections (e.g., input, output, or ground connections). For example, as shown in FIG. 1, each of the gate 310, drain 305, and source 315 contacts may extend in a first direction (e.g., the Y-direction) to define gate G, drain D, and/or source S 'fingers', which in some embodiments may be connected by one or more optional buses (e.g., by a gate bus 310b and a drain bus 305b; shown in phantom in FIG. 1) and/or wirebond connection pads coupled thereto on or adjacent an upper surface 324A of the semiconductor layer structure 390. The gate fingers G, drain fingers D, and source fingers S (and connecting buses and wirebond connection pads) may define part of gate-, drain-, and source-connected electrodes of the device 100, respectively, which in some embodiments may be defined by one or more top or frontside metallization layers or bus pads to which frontside pillars 366 (shown in phantom in FIG. 1) described herein may be coupled. In other embodiments, the frontside pillars 366 may be coupled to one or more of the gate fingers G, drain fingers D, or source fingers S without intervening bus pads or wirebond connection pads. As such, the die 100 may be free of wirebond connection pads and/or connecting buses at edges of the die 100, such that the transistor cells 200 may occupy a greater area of the die 100. Dielectric layers that isolate the various conductive elements of the frontside metallization structure from each other are not shown in FIG. 1 to simplify the drawing. Since the gate fingers G are electrically connected together, the drain fingers D are electrically connected together, and the source fingers S are electrically connected together, it can be seen that the unit cell transistors 200 are all electrically connected together in parallel.

As shown in FIGS. 2A to 2D, the transistor cell 200 may further include one or more dielectric or insulating layers, illustrated as 350, 355, and 360 adjacent the frontside 100f. The first insulating layer 350 may directly contact the upper surface of the semiconductor layer structure 390 (e.g., the upper surface 324A of the epitaxial layer 324). The second insulating layer 355 may be formed on the first insulating layer 350, and the third insulating layer 360 may be formed on the second insulating layer 355. It will also be appreciated that fewer or more than three insulating layers may be included in some embodiments. One or more of the insulating layers 350, 355, and/or 360 may serve as passivation layers for the transistor structure 200. The insulating layers 350, 355, 360 may be dielectric material, such as silicon nitride ($Si_xN_y$), aluminum nitride (AlN), silicon dioxide ($SiO_2$), silicon oxynitrides, and/or other suitable protective material, for example, magnesium oxide, scandium oxide, aluminum oxide and/or aluminum oxynitride. More generally, the insulating layers 350, 355, 360 may be a single layer or may include multiple layers of uniform and/or non-uniform composition, and/or may be sufficiently thick so as to protect the underlying epitaxial layer(s) 324 during a subsequent anneal of ohmic contacts (e.g., to provide the source contacts 315 and/or the drain contacts 305).

The source contact 315, the drain contact 305, and the gate contact 310 may be formed in the first insulating layer 350 adjacent the frontside 100f of the die 100. In some embodiments, at least a portion of the gate contact 310 may be on a surface of the first insulating layer 350. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 355 may be formed on the first insulating layer 350 and on portions of the drain contact 305, gate contact 310, and source contact 315.

Respective metal contacts 365 may be formed to extending through one or more of the insulating layer(s) 360, 355, 350 to contact one or more of the contacts 305, 310, 315. For example, the second insulating layer 355 may be patterned to form windows which expose the source contacts 315 and/or the drain contacts 305 for placement of the metal contacts 365. The windows may be etched utilizing a patterned mask and a low-damage etch with respect to the source contacts 315 and/or the drain contacts 305. Conductive metal may be formed on the exposed portions of the source contacts 315 and/or the drain contacts 305 to form the metal contacts 365.

The metal contacts 365 may directly contact one or more of the contacts 305, 310, 315 of the transistor cell 200 at the frontside 100f of the die 100. The metal contacts 365 may be used to provide connections to the gate bus 310b, drain bus 305b, and/or a source bus. The metal contacts 365 may contain metal or other highly conductive material, including, for example, copper, cobalt, gold, and/or a composite metal. The third insulating layer 360 (of similar or different composition than the insulating layers 350 and/or 355) may be formed on the metal contacts 365 as a final passivation layer, which may be patterned to define openings that expose the metal contacts 365 for electrical connection, e.g., for "off-chip" input or and/or output signal connections to one or more external devices, and/or for ground connections to an electrical ground.

In particular, one of the terminals of the respective unit cell transistors 200 of the RF transistor amplifier die 100 (e.g., the gate contact 310) may provide an input signal connection that is configured to be coupled to an RF input signal. One of the terminals of the respective unit cell transistors 200 (e.g., the drain contact 305) may provide an output signal connection that is configured to output an RF output signal. One of the terminals of the respective unit cell transistors 200 of the RF transistor amplifier die 100 (e.g., the source contact 315) may provide a ground connection that is configured to be coupled to a reference signal such as an electrical ground. The metal contacts 365 may thus define input (e.g., gate), output (e.g., drain), or ground (e.g., source) contact pads or terminals, which may be directly or indirectly connected to corresponding terminals of one or more transistor structures 200 (e.g., gate 310, drain 305, and/or source 315 terminals of a FET, such as a HEMT or LDMOS transistor) of the die 100.

In embodiments of the present disclosure, respective conductive pillar structures 366 (also referred to herein as frontside connections or pillars) may be formed on one or more of the metal contacts 365 on the frontside 100f of the die 100. The frontside pillars 366 are thus electrically connected to respective terminals (e.g., input signal, output signal, or ground connection terminals) of the unit cell transistors 200, and protrude from the insulating layer 360 opposite to and away from the surface 324A of the semiconductor layer structure 390. The frontside pillars 366 may have oval or circular shapes (e.g., similar or corresponding to the openings exposing the metal contacts 365) in plan view. The frontside pillars 366 may be relatively thick conductive plated structures in some embodiments. For example, the frontside pillars 366 may be Cu—or other metal-plated structures. The frontside pillars 366 may thus provide respective electrical connections (e.g., input signal, output signal, or ground connections) between one or more terminals of the transistor cells 200 (e.g., input, output, ground) and one or more external devices, for example, as a "flip-chip" (where the device 100 is flipped upside-down and attached and electrically connected to a substrate or device(s) thereon by the pillars 366 adjacent the frontside 100f of the device 100) and/or in a stacked multi-chip package. As shown in FIGS. 2A-2D, solder layers 367 may be provided on the frontside pillars 366 for electrical connection and/or attachment.

Figure 2A:
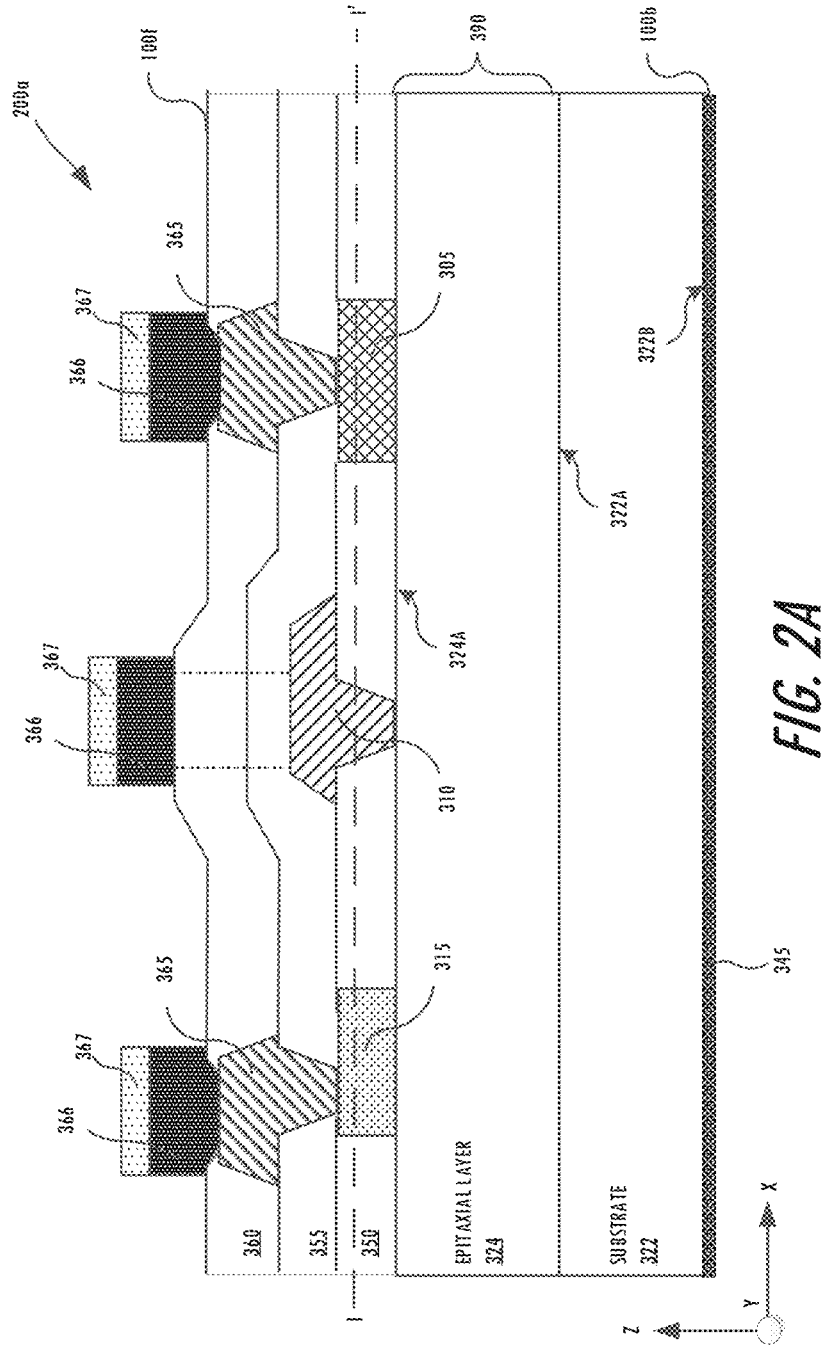
FIGS. 2A, 2B, 2C, and 2D are schematic cross-sectional views of RF transistor amplifier dies including transistor structures with various arrangements of frontside pillar connection structures according to some embodiments of the present disclosure.

FIGS. 2A-2D illustrate non-limiting examples of various input signal, output signal, and ground connections implemented using frontside pillars 366 according to some embodiments of the present invention. In particular, in some embodiments as shown in FIG. 2A, frontside pillars 366 are electrically coupled to all three terminals (gate 310, drain 305, and source 315) of the transistor structure 200a, e.g., to provide input signal, output signal, and ground connections, respectively, at the frontside 100f of the die 100.

Figure 2B:
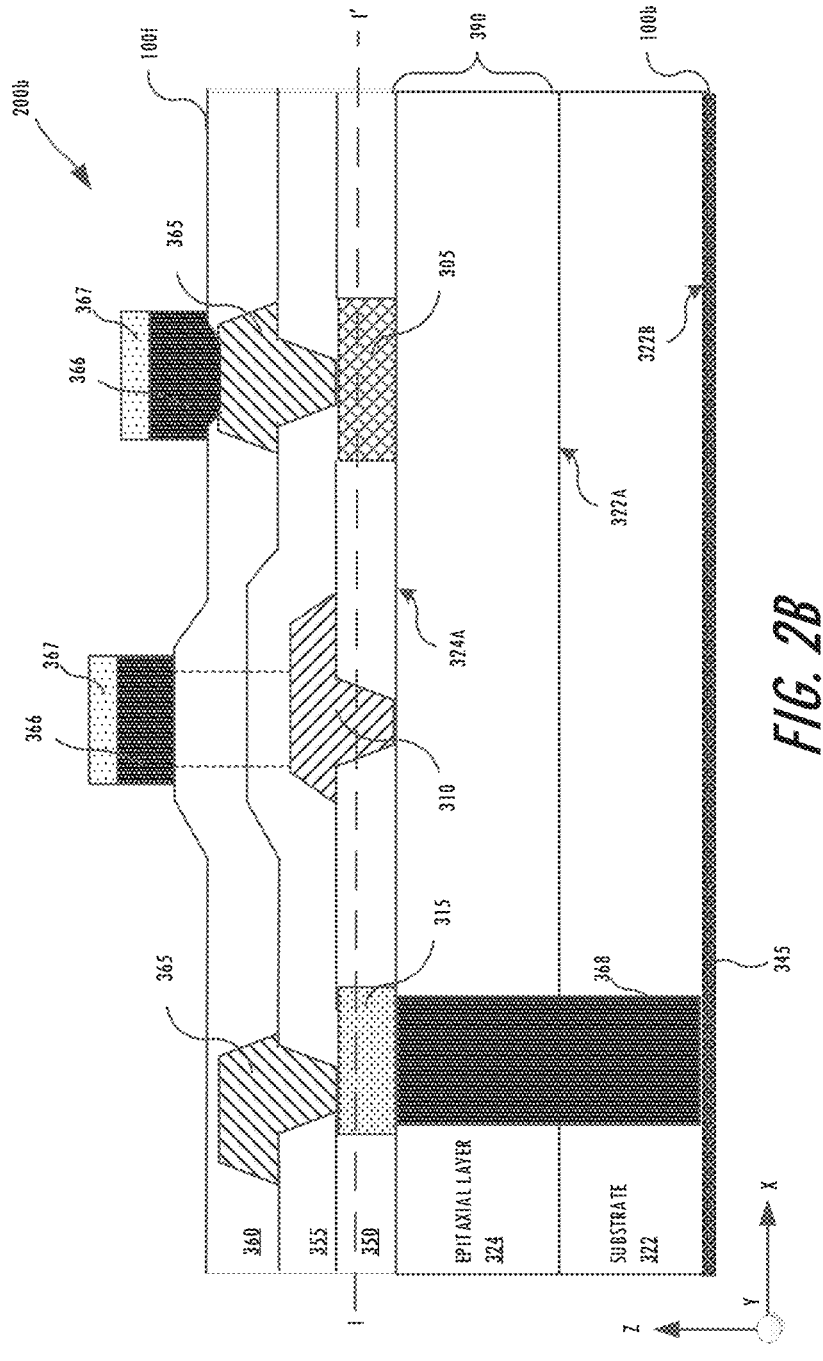

In some embodiments as shown in FIG. 2B, frontside pillars 366 are electrically coupled to the gate 310 and drain 305 terminals of the transistor structure 200b, e.g., to provide input and output signal connections, respectively, at the frontside 100f of the die 100. A conductive via connection or structure 368 (also referred to herein as a backside via) extends through the substrate 322 and epitaxial layer 324 to couple the source contact 315 to a metal contact 345 on the backside 100b of the die 100, e.g., to provide a ground connection.

Figure 2C:
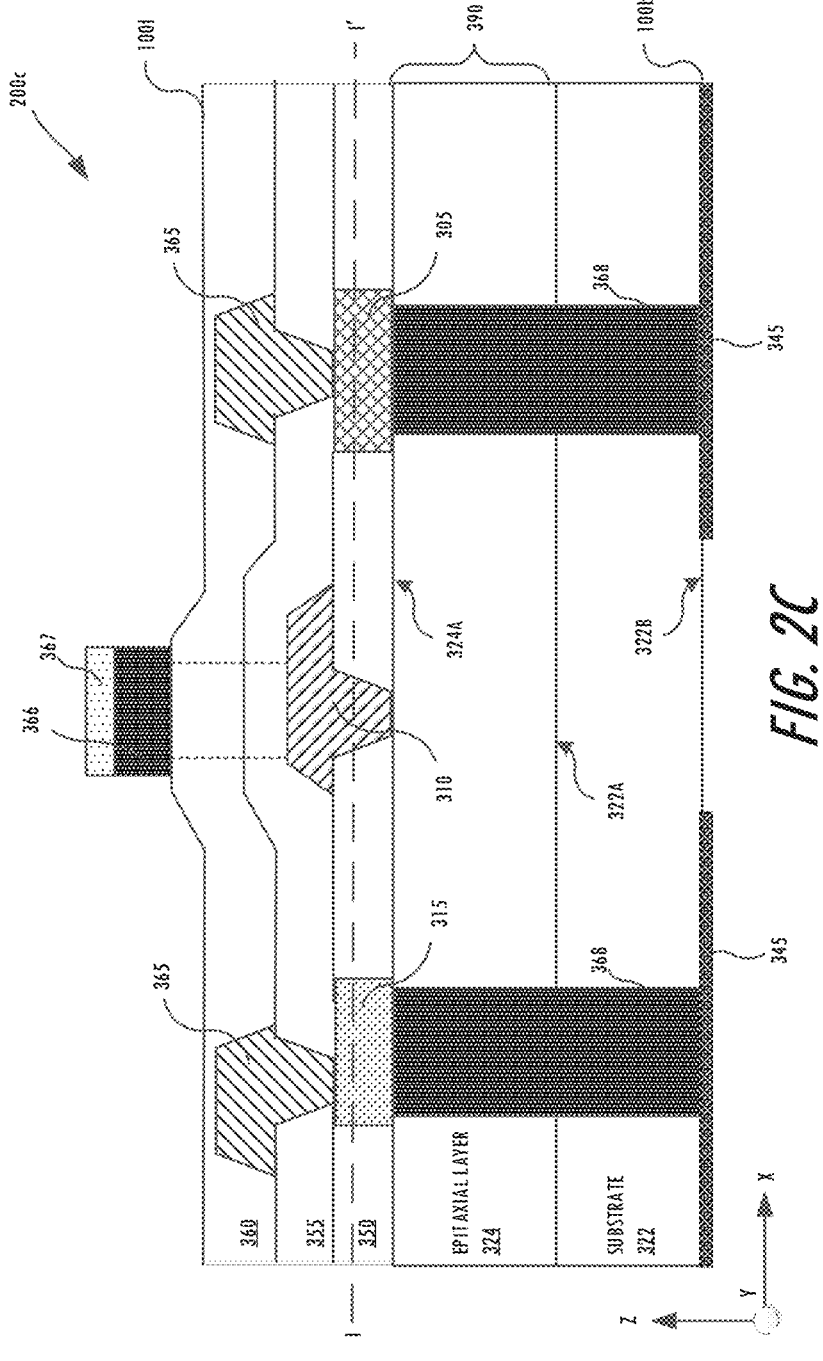

In some embodiments as shown in FIG. 2C, a frontside pillar 366 is electrically coupled to a gate terminal 310 of the transistor structure 200c, e.g., to provide an input signal connection at the frontside 100f of the die 100. Respective conductive through substrate via connections 368 extend through the substrate 322 and epitaxial layer 324 to couple the source and drain contacts 315 and 305 to respective metal contacts 345 on the backside 100b of the die 100, e.g., to provide a ground connection to the source contact 315, and to provide an output signal connection to the drain contact 305. A backside metal patterning step may be used to provide electrical isolation between the respective metal contacts 345.

Figure 2D:
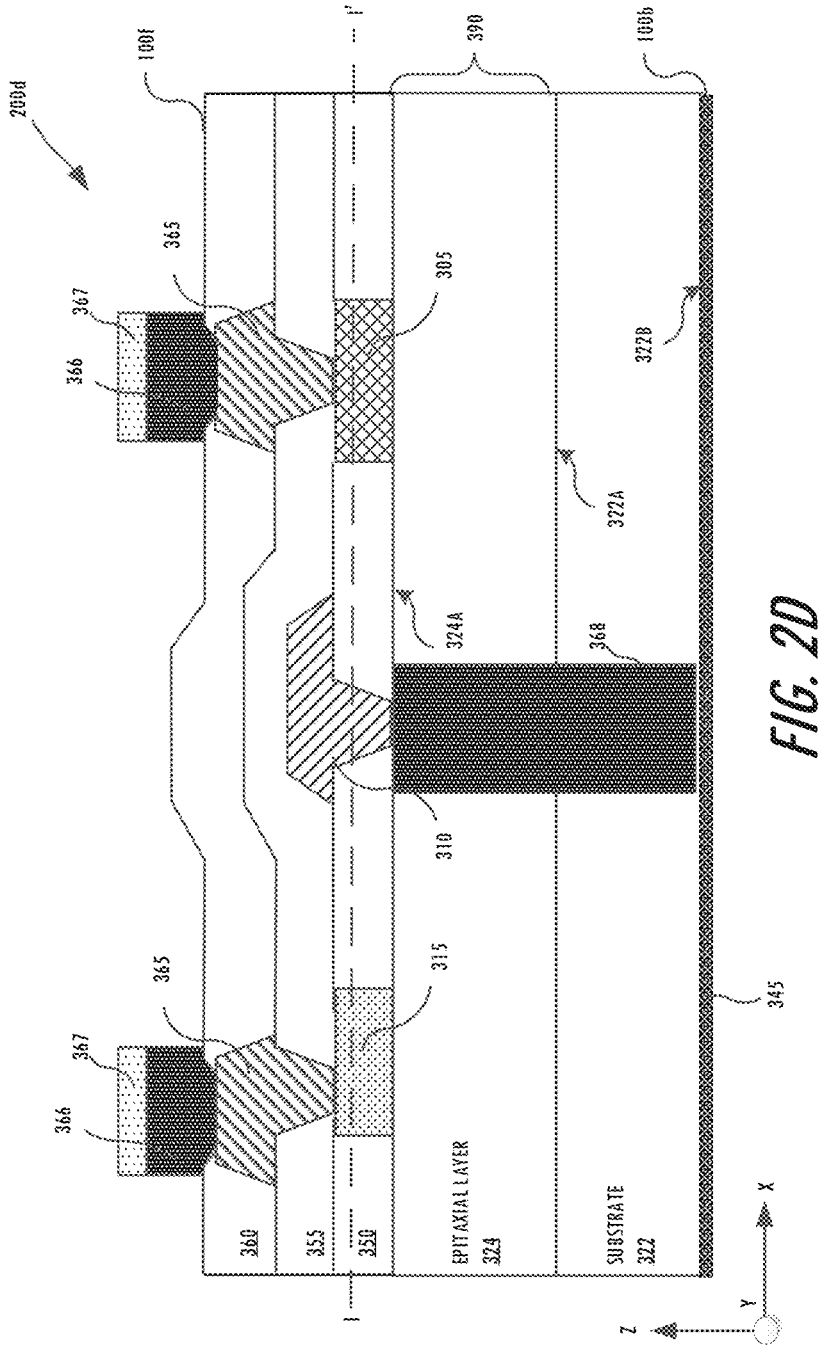

In some embodiments as shown in FIG. 2D, the frontside pillars 366 are electrically coupled to the drain 305 and source 315 terminals of a transistor structure 200d at the frontside 100f of the die 100, e.g., to provide output signal and ground connections, respectively. A conductive through substrate via connection or structure 368 extends through the substrate 322 and epitaxial layer 324 to couple the gate 310 to a metal contact 345 on the backside 100b of the die 100, e.g., to provide an input signal connection.

Transistor structures in which an input and/or output signal connection is routed through the substrate 322, as shown in the examples of FIGS. 2C and 2D, may be referred to herein as "hot via" configurations. More generally, in embodiments of the present invention, frontside pillars 366 may provide connections to one or more transistor terminals (e.g. input, output, ground) on the frontside 100f of the device 100, in some instances in various combinations with one or more backside vias 368 that provide connections to another of the transistor terminals (e.g. input, output, ground) on the backside 100b of the device 100. That is, embodiments of the present invention may include any combination of frontside pillars 366 and backside vias 368 that respectively provide input signal, output signal, or ground connections.

The frontside 100f of the device 100 including the frontside pillars 366 protruding from the insulating layer 360 may be "flipped" and attached (frontside 100f down) to a wafer carrier (for example, to provide structural support for further processing operations), or to a package substrate (for example, a printed PCB or RDL structure) such that the frontside pillars 366 are physically attached and electrically connected to corresponding conductive traces on the package substrate, e.g., by the solder layers 367, for electrical signal routing. The frontside pillars 366 may protrude from the insulating layers 350, 355, 360 of the device 100, but in some embodiments additional support layers (e.g., additional insulating and/or adhesive layers) may surround or encapsulate the pillars 366 for mechanical support. An RDL structure refers to a substrate or laminate that has conductive layer patterns and/or conductive via structures (also referred to herein as conductive vias). RDL structures may be fabricated using semiconductor processing techniques, e.g., by depositing conductive and insulating layers and/or patterns on a base material and by forming vias and copper routing patterns within the structure for transmitting signals through the RDL structure. The need and/or use of wire bonds (which may introduce series inductance that can reduce or negate the effectiveness of impedance matching networks and/or harmonic termination circuits, particularly at the higher frequencies of RF applications) may thereby be reduced or eliminated in some embodiments.

In addition, depending on the package integration, the frontside pillars 366 may provide some chip-to-chip or chip-to-board separation, increase heat dissipation from the frontside 100f of the device 100, increase mechanical strength, and/or (particularly in a "flip-chip" package) increase design flexibility by allowing the placement of the connection pads or pillars away from the edges or periphery of the die 100, and with any combination of frontside and/or backside input/output/ground connections. Fabrication operations for forming devices including arrangements of frontside pillars 366 in accordance with some embodiments of the present invention are described, for example, in U.S. patent application Ser. No. 16/889,432, to Alcorn et al., the disclosure of which is incorporated by reference herein.

Embodiments of the present invention may include any combination whereby frontside pillar structures provide at least one of the input signal, output signal, or ground connections. For example, the placement of the frontside pillars (e.g., in a linear or "strip" arrangement, or in a sparse or "dot" arrangement) in relationship to the gate lines or fingers may be used to reduce gate resistance and/or increase RF signal isolation. In particular, some embodiments of the present invention may provide arrangements of frontside pillars that are coupled to one or more of input, output, or ground connections of the transistor cells, and are arranged between the input and output signal connections (to increase isolation of the RF signal therebetween) and/or between opposing ends of the gate fingers (to shorten the RF signal propagation path and thus reduce resistance). Various combinations of frontside pillars and backside connections in accordance with embodiments of the present disclosure are described below with reference to the examples of FIGS. 3A-B, 4, 5, 7, and 8.

Figure 3A:
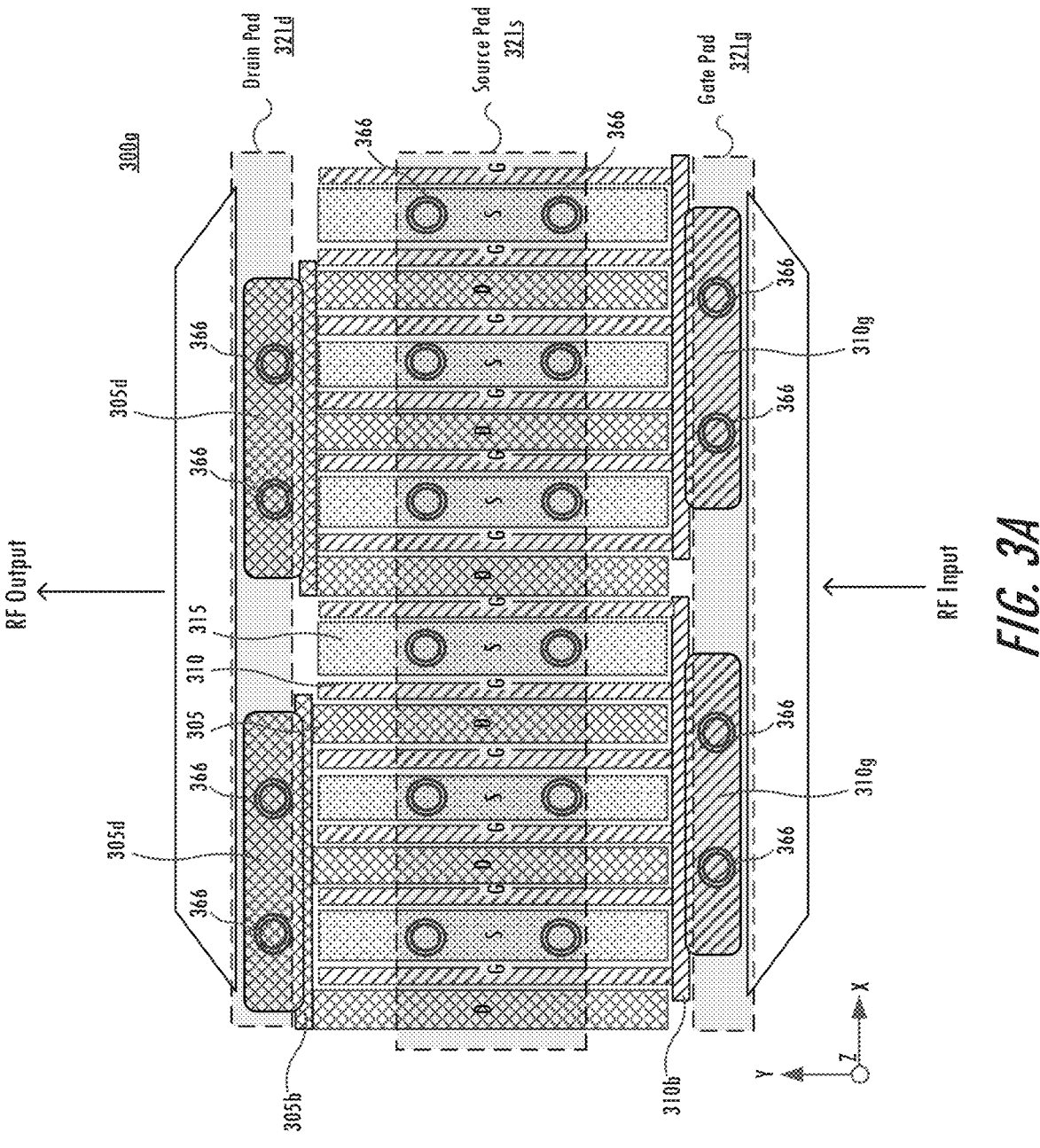
FIGS. 3A and 3B are schematic plan views of RF transistor amplifier dies including arrangements of frontside pillar connection structures without backside connection pads or contacts according to some embodiments of the present disclosure.

FIG. 3A is a schematic plan view of a RF transistor amplifier die according to some embodiments of the present disclosure. As shown in FIG. 3A, a transistor amplifier die 300a includes frontside pillar connections 366 coupled to the gate contacts 310, drain contacts 305, and source contacts 315 to provide input signal, output signal, and ground connections, respectively, at the frontside 100f of the die 300a, without the use of backside contacts. The frontside pillars 366 are thus electrically connected to the terminals (e.g., input signal, output signal, or ground connection terminals) of the unit cell transistors 200, and protrude from the insulating layer 360 (in the Z-direction) opposite to and away from the surface 324A of the semiconductor layer structure 390. In particular, the frontside pillars 366 that provide the input signal connections are coupled to wirebond connection pads 310g (which are electrically connected to the gate bus 310b), and the frontside pillars 366 that provide the output signal connections are coupled to wirebond connection pads 305d (which are electrically connected to the drain bus 305b). The frontside pillars 366 that provide the ground connections are coupled to the source contacts 315 between opposing ends of the source fingers S, free of or without intervening wirebond connection pads in the electrical connection path.

The frontside pillars 366 providing the input signal, output signal, and ground connections are aligned with corresponding conductive connection patterns on a package substrate (shown in phantom in FIG. 3A as conductive "connection strips" 321g, 321d, and 321s extending along the width of the die 300a in the X-direction) to provide a single input, single output RF signal path between opposing edges of the die 300a (in the Y-direction). In other words, a package substrate (onto which the die 300a may be attached) includes conductive connection strips 321g, 321d, and 321s that are aligned with pillars 366 that provide the input signal, output signal, and ground connections, respectively. The frontside pillars 366 that provide the ground connection (e.g., coupled to the source fingers S) are arranged between the input and output signal connections (e.g., as provided by the frontside pillars 366 coupled to the pads 310g and 305d), which may provide improved isolation between the RF input signal and the RF output signal. The package substrate to which the die 300a may be attached may include correspondingly-arranged connection strips 321g, 321d, and 321s as gate, drain, and source pads, respectively.

While shown in FIG. 3A with reference to two frontside pillars 366 connected to each source finger S, it will be understood that fewer or more frontside pillars 366 may be connected to each source finger S, where more pillars 366 per finger S may reduce source impedance. Also, in FIG. 3A, the frontside pillars 366 providing the input signal connections are coupled to the pads 310g (which are electrically connected to the gate bus or manifold 310b), and the frontside pillars 366 providing the output signal connections are coupled to the pads 305d (which are electrically connected to the drain bus or manifold 305b), where the wirebond connection pads 310g and 305d are positioned at opposing edges of the die 300a. The RF signal must thus propagate the full length between the opposing edges of the die 300a (along the Y-direction), such that the input signal path may have a relatively high resistance, which may result in latency issues and/or losses, particularly at higher operating frequencies.

Figure 3B:
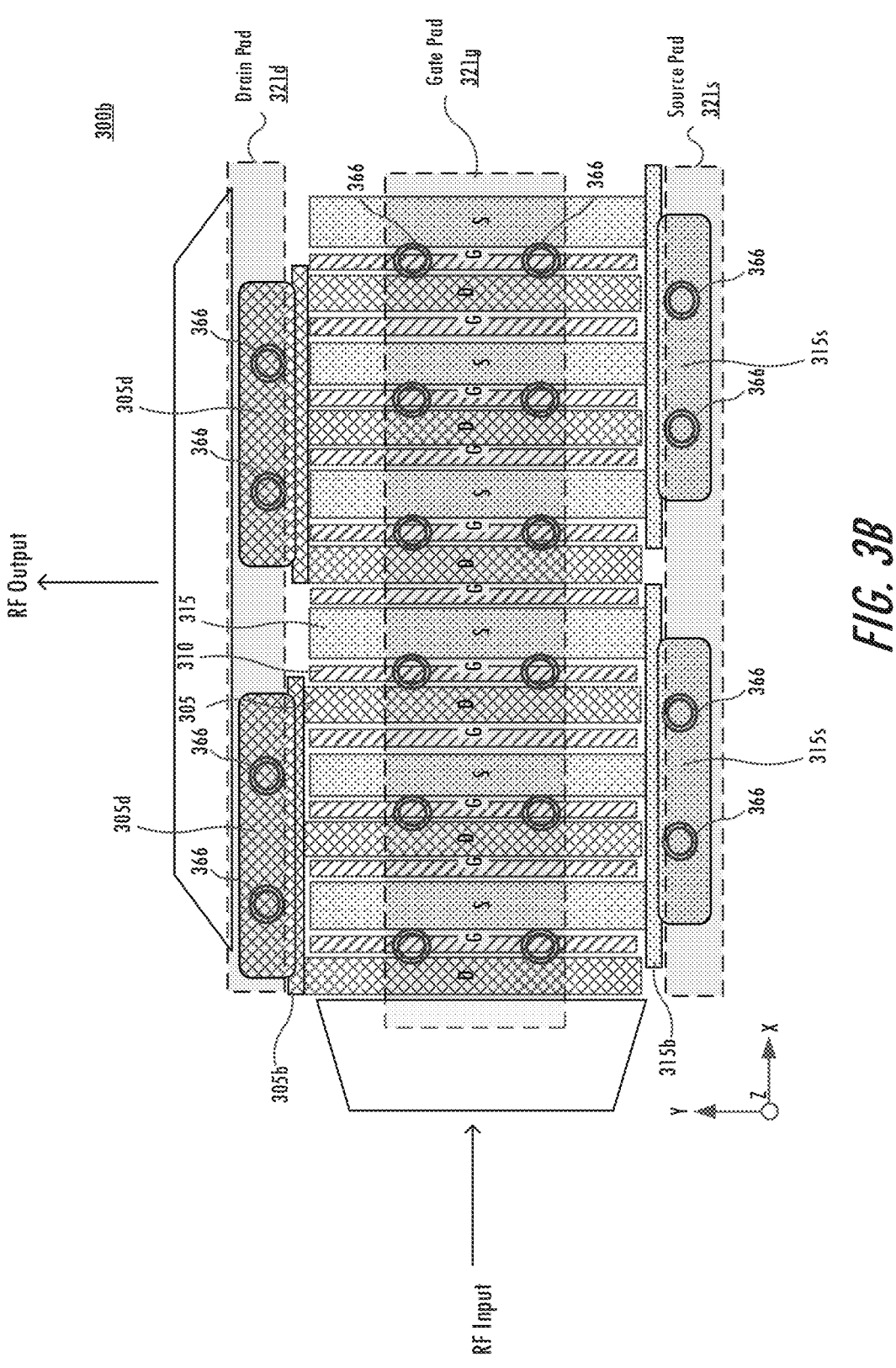

FIG. 3B is a schematic plan view of a RF transistor amplifier die including arrangements of frontside pillar connection structures without backside connection pads or contacts according to further embodiments of the present disclosure. As shown in FIG. 3B, a transistor amplifier die 300b includes frontside pillar connections 366 coupled to the gate contacts 310, drain contacts 305, and source contacts 315 to provide input signal, output signal, and ground connections, respectively, at the frontside 100f of the die 300b. The frontside pillars 366 protrude from the insulating layer 360 (in the Z-direction) opposite to and away from the surface 324A of the semiconductor layer structure 390, such that the die 300b may be free of backside contacts. In particular, the frontside pillars 366 that provide the output signal connections are coupled to wirebond connection pads 305d (which are electrically connected to the drain bus 305b), and the frontside pillars 366 that provide the ground connections are coupled to wirebond connection pads 315s (which are electrically connected to a source bus 315b). The frontside pillars 366 that provide the input signal connections are coupled to the gate contacts 310 between opposing ends of the gate fingers G, free of wirebond connection pads in the electrical connection path therebetween. While shown in FIG. 3B with reference to two frontside pillars 366 connected to each gate finger G, it will be understood that fewer or more frontside pillars 366 may be connected to each gate finger G. In some embodiments, each frontside pillar 366 that provides the input signal connection may be connected to two or more gate fingers G, which may be referred to as a "branched" gate connection. For example, in a branched gate connection, a frontside pillar 366 may be coupled to respective gate contacts 310 via respective lower level (e.g., M1) metal layers and a common upper level (e.g., M2) metal layer that connects the M1 metal layers, as shown in FIG. 6A2. The connection of the frontside pillars 366 between opposing ends of the gate fingers G may provide increased uniformity with respect to signal timing or propagation delays, and the branched gate arrangement may allow for increased density of the gate fingers G (as a plurality of gate fingers G may be connected to one frontside pillar 366).

The frontside pillars 366 providing the input signal, output signal, and ground connections are aligned with corresponding conductive pad structures on a package substrate (shown in phantom in FIG. 3B as connection strips 321g, 321d, and 321s extending along the width of the die 300b in the X-direction) to provide a single input, single output RF signal path. The frontside pillars 366 that provide the ground connection (e.g., coupled to the source fingers S) are thus arranged at one edge of the die 300b, with the frontside pillars 366 providing the input signal connection (e.g., coupled to the gate fingers G) arranged between the ground connection and the output signal connection at the opposing edge of the die. The package substrate to which the die 300b may be attached may include correspondingly-arranged connection strips 321g, 321d, and 321s.

The placement of the frontside pillars 366 providing the input signal connections coupled to the gate fingers G in the middle of the die 300b may shorten the input signal path length, thereby reducing gate resistance Rg and improving RF gain. However, in comparison to the die 300a of FIG. 3A, the die 300b arranges the frontside pillars 366 providing the input signal connections between the wirebond connection pads 315s and 305d providing the ground and output signal connections, respectively, at opposing edges of the die 300b. The closer proximity of the frontside pillars 366 providing the input signal connections to the output signal connections provided by the frontside pillars 366 coupled to the drain bus pad 305d may reduce isolation between the RF input signal and the RF output signal.

While providing all of the input, output, and ground connections at the frontside 100f of the transistor die using frontside pillars 366 as described herein may be advantageous with respect to fabrication complexity, further embodiments of the present disclosure may include frontside pillars 366 in combination with backside contacts 345. However, it will be understood that any combination of frontside pillars that provide at least one of input signal, output signal, or ground connections may be used.

Figure 4:
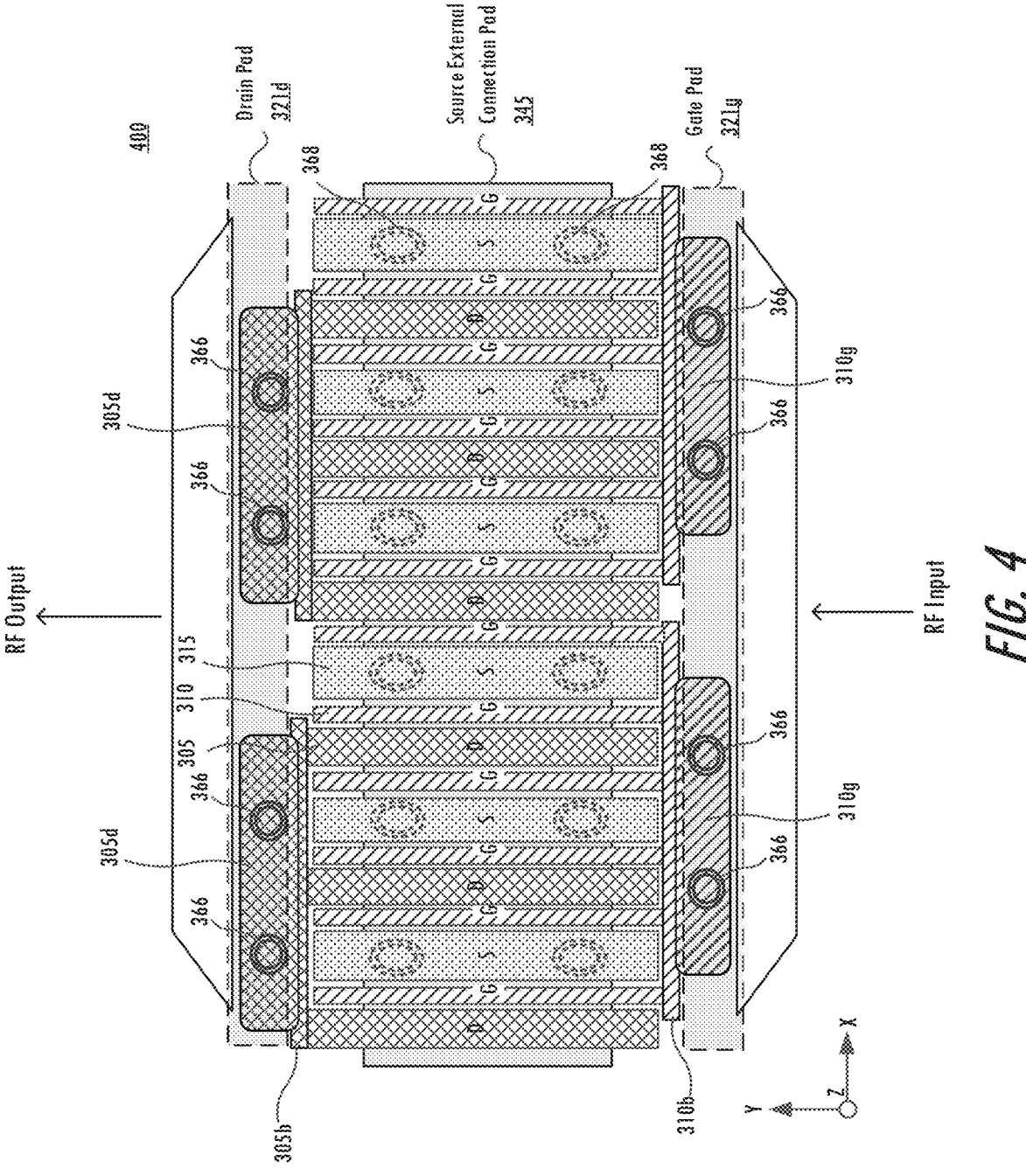
FIG. 4 is a schematic plan view of a RF transistor amplifier die including arrangements of frontside pillar connection structures and backside connection pads or contacts according to some embodiments of the present disclosure.

FIG. 4 is a schematic plan view of a RF transistor amplifier die including arrangements of frontside pillar connection structures and backside connection pads or contacts according to some embodiments of the present disclosure. As shown in FIG. 4 a transistor amplifier die 400 includes frontside pillars 366 coupled to the gate contacts 310 and drain contacts 305 to provide input and output signal connections, respectively, at the frontside surface 100f of the die 400, in combination with a backside contact 345 coupled to the source contacts 315 by conductive through substrate vias 368 to provide the ground connection. The frontside pillars 366 thus protrude from the insulating layer 360 (in the Z-direction) away from the surface 324A of the semiconductor layer structure 390 and opposite from the surface 322B including the backside contact 345.

In particular, the frontside pillars 366 that provide the input signal connections are coupled to the wirebond connection pads 310g, and the frontside pillars 366 that provide the output signal connections are coupled to the wirebond connection pads 305d, with the ground connection provided by a backside contact 345 that is coupled to the source contacts 315 by respective through substrate vias 368 from the backside surface 100b. The through substrate vias 368 that provide the ground connections are coupled to the source contacts 315 between opposing ends of the source fingers S, and extend through the semiconductor layer structure 390 and substrate 322 to provide electrical connection with the backside contact 345.

The frontside pillars 366 providing the input and output signal connections are aligned with corresponding conductive pad structures on a package substrate (shown in phantom in FIG. 4 as connection strips 321g and 321d, extending along the width of the die 400 in the X-direction) to provide a single input, single output RF signal path between opposing edges of the die 400 (in the Y-direction). However, without the frontside pillars 366 providing intervening ground connections between the frontside pillars 366 providing the input signal and/or output signal connections, the series input-output connections shown in FIG. 4 may present challenges with regard to RF signal isolation, and the input versus output proximity may present limitations for higher power applications.

Figure 5:
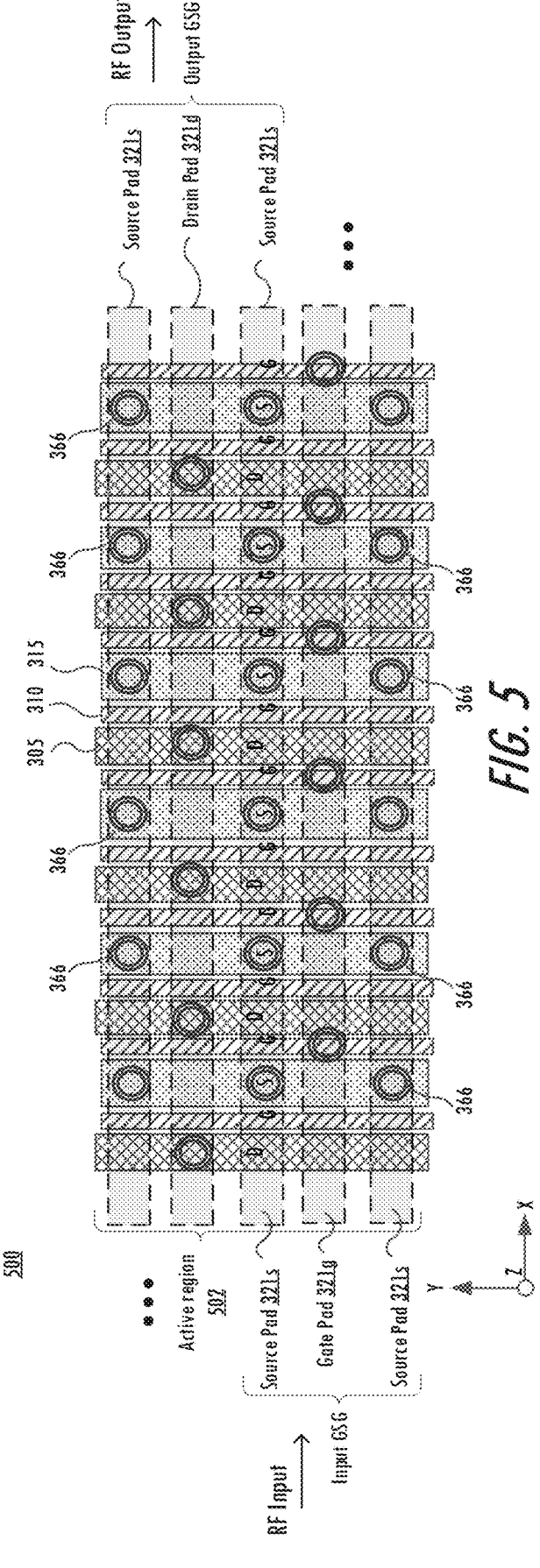
FIG. 5 is a schematic plan view of a RF transistor amplifier die including arrangements of frontside pillar connection structures coupled to source, gate, and drain fingers without intervening wirebond connection pads, and with the input and output signal connections and the ground connections interlaced according to some embodiments of the present disclosure.

FIGS. 5, 7, and 8 illustrate examples in which the input and/or output signal connections are interlaced with the ground connections. Although illustrated with reference to input signal, output signal, and ground connections provided by frontside pillars without backside contacts in FIGS. 5, 7, and 8, it will be understood that in some embodiments one or more of the input, output, or ground connections may be routed to the backside of the die using respective conductive vias 368 as described herein.

FIG. 5 is a schematic plan view of a RF transistor amplifier die with the ground connections and the input and output signal connections interlaced according to some embodiments of the present disclosure. As shown in FIG. 5, a transistor die 500 includes frontside pillars 366 that are coupled to the gate contacts 310, drain contacts 305, and source contacts 310 between opposing ends of the gate, drain, and source fingers G, D, and S, respectively, rather than to external wirebond connection pads or bus pads at edges of the die 500. The frontside pillars 366 provide the input signal, output signal, and ground connections, and are aligned with corresponding conductive connection patterns or pad structures on a package substrate (shown in phantom in FIG. 5 as connection strips 321g, 321d, and 321s extending along the width of the die 500 in the X-direction) to provide a single input, single output RF signal path between opposing edges of the die 500 (in the X-direction).

The frontside pillars 366 that provide the ground connections (e.g., coupled between the opposing ends of the source fingers S) are arranged in an alternating or interlaced manner with the frontside pillars 366 that provide the input signal connections (e.g., coupled between the opposing ends of the gate fingers G) and the output signal connections (e.g., coupled between the opposing ends of the drain fingers D), referred to herein as a GSG (ground-signal-ground) configuration. In particular, in FIG. 5, the frontside pillars 366 providing the input signal connections (e.g., coupled to the gate fingers G) are arranged between frontside pillars 366 providing the ground connection (e.g., coupled to the source fingers S) in an input GSG configuration Likewise, the frontside pillars 366 providing the output signal connections (e.g., coupled to the drain fingers D) are arranged between frontside pillars 366 providing the ground connection in an output GSG configuration. However, it will be understood that either the input or the output signal connections may be arranged alternating or interlaced with the ground connections in some embodiments. That is, the RF signal connections (at the input, at the output, or both) may be provided in a GSG configuration by interlacing the frontside pillars 366 that provide the ground connections therebetween.

The package substrate (onto which the transistor die 500 can be flipped and attached with the frontside pillars 366 facing down or towards the surface of the package substrate) includes connection strips 321g, 321d, and 321s that are aligned corresponding to the arrangement of the frontside pillars 366 providing gate pads, drain pads, and source pads for the input, output, and ground connections, respectively. In particular, the package substrate includes input (e.g., gate) connection strips 321g interlaced or interdigitated between adjacent ground (e.g., source) connection strips 321s, and output (e.g., drain) connection strips 321d interlaced or interdigitated between adjacent ground connection strips 321s. That is, the conductive routing 321g, 321d, and 321s in and/or on the package substrate is arranged to correspond to the input and/or output GSG configurations. In the example of FIG. 5, the middle connection strip 321s is included in both the input GSG and the output GSG.

The input and/or output GSG configurations may provide improved RF isolation between the input and output RF signals, as well as improved signal integrity, by effectively sandwiching the input (and/or output) signal connections between adjacent ground connections. Also, arranging the frontside pillars 366 that provide the input signal connections between the opposing ends of the gate fingers G may shorten the input signal propagation path, thereby reducing resistance Rg. The respective positions of the frontside pillars 366 may also be arranged to address and/or equalize signal latency issues.

In the example of FIG. 5, the frontside pillars 366 are coupled to the gate fingers G, drain fingers D, and source fingers S without intervening wirebond connection pads or bus pads therebetween. That is, the transistor die 500 may be free of wirebond connection pads, such as gate, drain, and/or source bus/bond pads, with the respective frontside pillars extending through one or more of the insulating layers 350, 355, and/or 360 to contact the gate contacts 310, drain contacts 305, and/or source contacts 310 (or intervening metal layers 365 electrically connected to the contacts 310, 305, 315). By arranging the frontside pillars 366 on the central area of the die including the active region 502 for the transistor cells 200 (rather than at edges of the die 500) to provide the input, output, and/or ground connections without intervening wirebond connection pads or bus pads, the gate fingers G, drain fingers D, and/or source fingers S may extend along up to the entirety of the length of the die 500, thereby increasing the available area on the die 500 for the transistor active region 502.

As shown in FIGS. 6A1, 6B1, and 6C1, the frontside pillars 366 providing the input signal, output signal, or ground connections may be coupled to a gate 310, drain 305, or source 315 contact, respectively, in some embodiments by one or more intervening metal layers M1, M2. Alternatively, as shown in FIGS. 6A2, 6B2, and 6C2 each of the frontside pillars 366 providing the input signal, output signal, or ground connections may be coupled to multiple (illustrated as two) gate contacts 310, drain contacts 305, or source contacts 315, respectively, in a branched arrangement. For example, each frontside pillars 366 may be coupled to respective gate contacts 310, drain contacts 305, or source contacts 315 via respective M1 metal layers and a M2 metal layer that connects the M1 metal layers. Coupling the frontside pillars 366 to the contacts 310, 305 in a branched configuration may provide increased uniformity with respect to signal timing or propagation delays, as the frontside pillars 366 may be arranged to provide similar input or output signal path lengths to the respective contacts 310, 305, and with increased density of the fingers G, D, S (as a plurality of narrower fingers G, D, S may be connected to one frontside pillar 366).

Figure 7A:
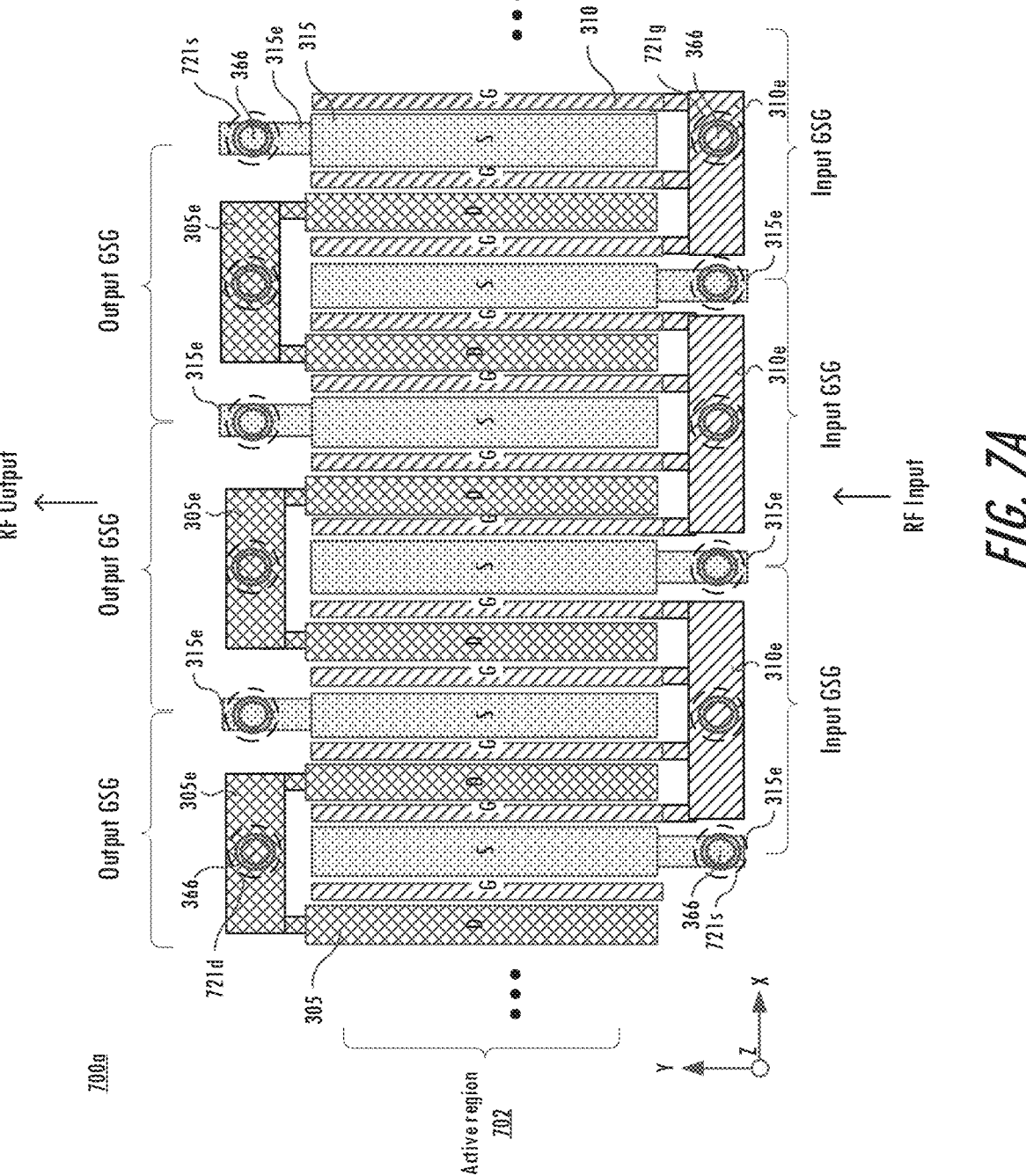
FIGS. 7A and 7B are schematic plan views of RF transistor amplifier dies including arrangements of frontside pillar connection structures that are coupled to respective extensions at edges of the gate, drain, and source fingers, with the ground connections interlaced between the input signal connections and between the output signal connections, according to some embodiments of the present disclosure.
Figure 7B:
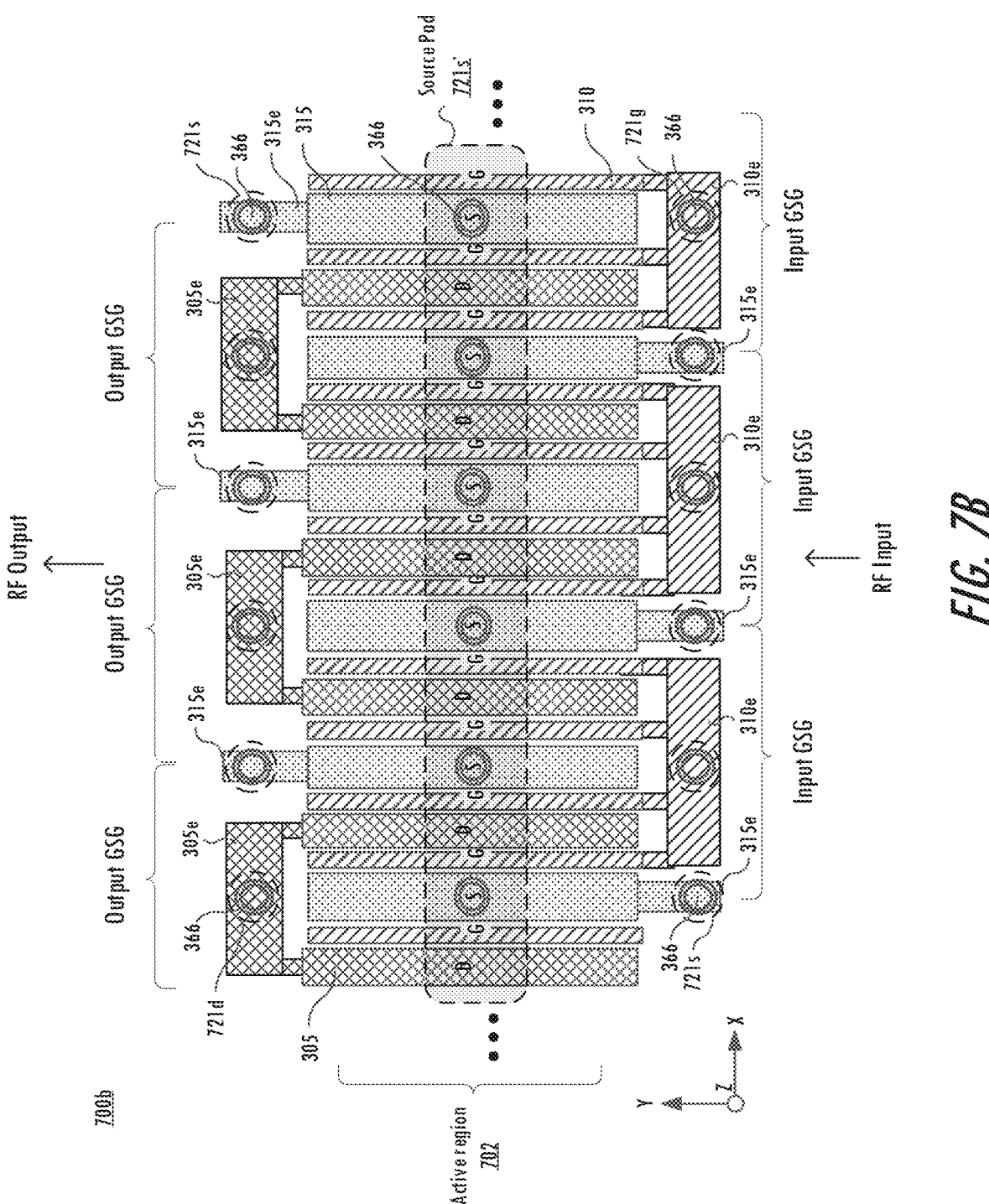

FIGS. 7A and 7B are schematic plan views of RF transistor amplifier dies including arrangements of frontside pillar connection structures that are coupled to respective extensions at edges of the gate, drain, and source fingers, with the ground connections alternating or interlaced between the input signal connections and between the output signal connections, according to some embodiments of the present disclosure. As shown in FIGS. 7A and 7B, a transistor die 700a, 700b includes frontside pillars 366 that are coupled to the gate fingers G, drain fingers D, and source fingers S (and thus, the gate 310, drain 305, and source 315 contacts) by respective extensions 310e, 305e, and 315e at opposing edges of the fingers G, D, and S. The extensions 310e, 305e, 315e (also referred to herein as finger extensions or extension regions) and the frontside pillars 366 connected thereto are aligned with corresponding conductive connection patterns or pad structures on the package substrate (shown in phantom in FIGS. 7A and 7B as "connection dots" 721g, 721d, and 721s that are spaced apart from one another along the width or X-direction), to provide a single input, single output RF signal path between opposing edges of the die 700a, 700b (in the Y-direction). In other words, a package substrate (onto which the die 700a, 700b may be attached) includes conductive connection patterns implemented by connection dots 721g, 721d, and 721s that are respectively aligned with the frontside pillars 366 that provide the input signal, output signal, and ground connections, respectively.

The transistor die 700a, 700b includes ground connections that are arranged in an interlaced or alternating manner in a GSG configuration with both the input and output signal connections, although it will be understood that either the input or the output signal connections may be arranged interlaced with the ground connections in some embodiments. In particular, the frontside pillars 366 that provide the input signal connections (e.g., coupled to the gate finger extensions 310e) are arranged between frontside pillars 366 that provide the ground connection (e.g., coupled to the source finger extensions 315e) in an input GSG configuration Additionally or alternatively, the frontside pillars 366 that provide the output signal connections (e.g., coupled to the drain finger extensions 305e) are arranged between frontside pillars 366 that provide the ground connection in an output GSG configuration.

The package substrate (to which the die 700a, 700b may be attached) may include connection dots 721s, 721d, and 721s as gate, drain, and source pads that are arranged corresponding to the arrangement of the frontside pillars 366 on the extension regions 310e, 305e, and 315e to provide the input, output, and ground connections. In particular, input (e.g., gate) connection dots 721g may be alternated or interlaced between adjacent ground (e.g., source) connection dots 721s along one end of the package substrate, and output (e.g., drain) connection dots 721d may be alternated or interlaced between adjacent ground connection dots 721s along the opposing end of the package substrate. As such, the input and output GSG configurations may be provided at the gate, drain, and source finger-level, with the respective connection dots 721s, 721d, or 721s coupled to the respective fingers G, D, or S by the respective frontside pillars 366 and finger extensions 310e, 305e, or 315e. The die 700b of FIG. 7B includes additional frontside pillars 366 coupled to the source fingers S between opposing ends thereof (that is, between the input GSGs and the output GSGs), which are aligned with an additional source pad or strap 721s' connection pattern on the package substrate (shown in phantom in FIG. 7B) to provide additional input-to-output isolation, in a manner similar to the source pad 321s discussed above with reference to FIG. 3A.

The package substrate may further include electrical connections therein or thereon that electrically connect the input or output connection dots 721g or 721d to route the RF signal into or out of the package, respectively. For example in the illustrated device 700a, 700b of FIGS. 7A and 7B, the package substrate may include conductive traces that combine the RF input signal paths, and conductive traces that combine the RF output signal paths for RF signal routing into and out of a package, respectively.

The input and/or output GSG configurations may reduce or avoid signal interference between the parallel input connections and/or parallel output connections by providing RF signal isolation for the respective input and/or output signal paths. For example, in some conventional designs, the input or output to a die may include an input or output wire bundle containing a plurality of input or output wirebonds, but the signals propagating withing each input or output wire bundle may interfere with one another. Off-pad (e.g., pad-to-pad) resistors may be used in such designs to alleviate interference between signals propagating on adjacent input or output wires. However, the input and/or output GSG configurations described herein may include intervening ground connections between signals propagating on adjacent input or output signal paths, thereby increasing isolation and reducing or avoiding signal interference within each input or output bundle 310e or 305e, without the use of resistors between adjacent input finger extensions 310e and/or between adjacent output finger extensions 305e.

In the example of FIG. 7A, the frontside pillars 366 are coupled to the gate, drain, and source finger extensions 310e, 305e, and 315e at opposing ends of the die 700a, in areas outside the transistor active region 702 (which includes the gate fingers G, drain fingers D, and source fingers S thereon). That is, the extension regions 310e, 305e, and/or 315e may be provided at opposing ends of the fingers G, D, S, such that the active region 702 of the transistor die 700a may be free of frontside pillar connections 366.

Also, in the example of FIGS. 7A and 7B, subsets of the gate fingers G are coupled to a common frontside pillar 366 by the respective gate finger extensions 310e, and are electrically isolated from other subsets of the gate fingers G by the interlaced or interdigitated source finger extensions 315e. The isolation between subsets of gate fingers G may allow for higher gate densities in the active region 702. Subsets of the drain fingers D are likewise coupled to each frontside pillar 366 by the respective drain finger extensions 305e, and are electrically isolated from other subsets of the drain fingers D by the interlaced or interdigitated source finger extensions 315e. That is, the ground extension regions 315e may be provided between the input extension regions 310e on one side of the die 700a, 700b, and/or between the output extension regions 305e on the other side of the die 700a, 700b, to provide isolation between respective GSG groups defined by the frontside pillars 366. In other words, the input and/or output signal connections may each include multiple (shown as three) GSG configurations, with isolation provided by the ground extensions 315e interlaced or alternatingly arranged between the extension regions 310e or 305e in each GSG group. In FIG. 7B, additional isolation is provided between the input and output signal connections by the pillars 366 that are arranged to be coupled to the source strap 721s'.

The transistor die 700a, 700b includes an example pattern of extension regions 310e, 305e, 315e where each input extension region 310e and output extension region 305e is arranged opposite to a ground connection 315e, but embodiments of the present invention are not limited to such an arrangement. Likewise, while shown in FIGS. 7A and 7B with reference to one frontside pillar 366 connected to each extension region 310e, 305e, 315e, it will be understood that fewer or more frontside pillars 366 may be connected to each source finger S, where more pillars 366 per finger S may reduce source impedance. Also, in FIGS. 7A and 7B, the frontside pillars 366 providing the input signal connections are coupled to the gate extensions 310e, and the frontside pillars 366 providing the output signal connections are coupled to the drain extensions 305e, where the extensions 310e and 305e are positioned at opposing edges of the die 700a, 700b. The RF signal must thus propagate the full length between the opposing edges of the die 700a, 700b (along the Y-direction), such that the input signal path may have a relatively high resistance, which may result in latency issues and/or losses, particularly at higher operating frequencies.

Figure 8A:
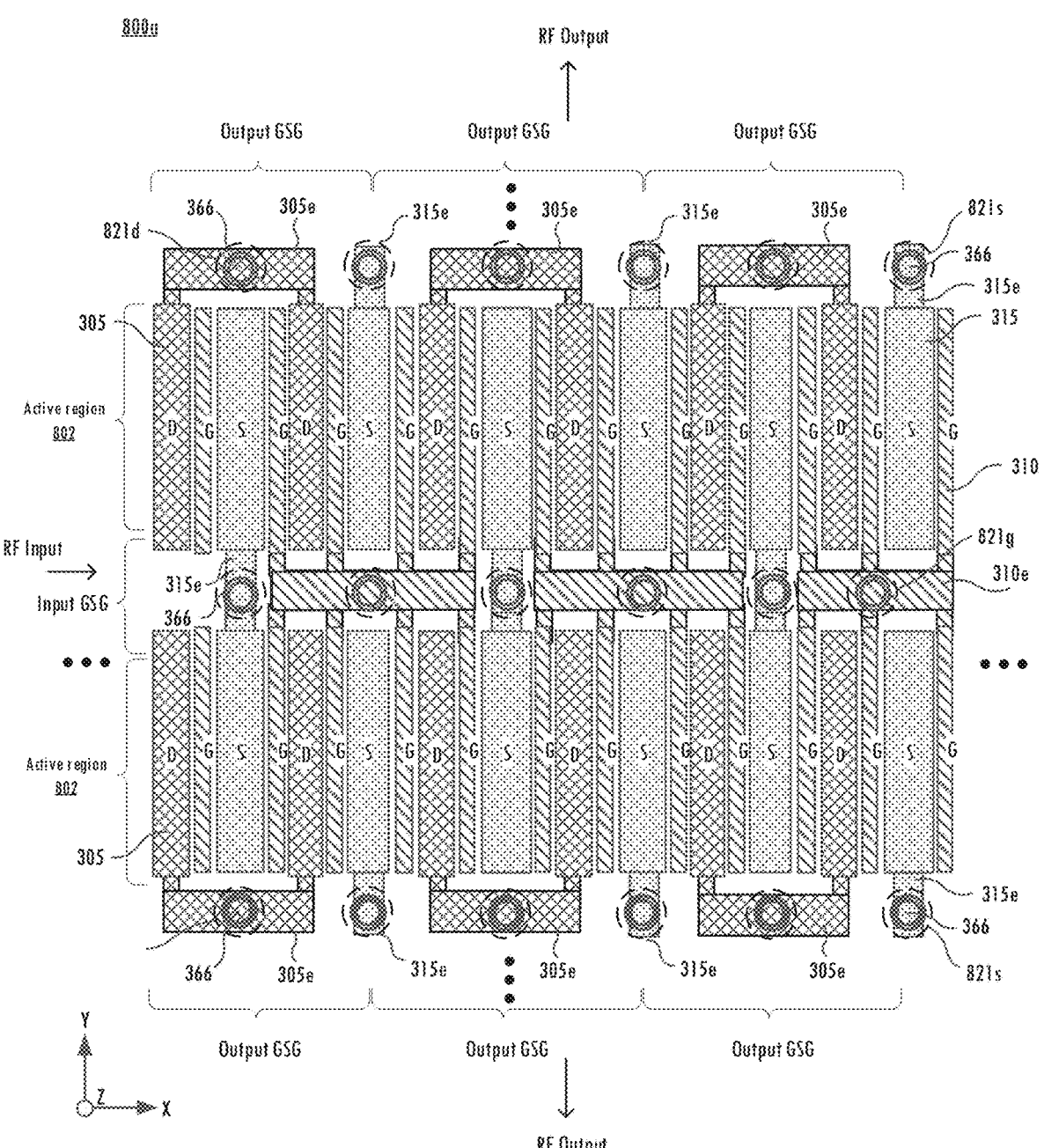
FIGS. 8A and 8B are schematic plan views of RF transistor amplifier dies including arrangements of frontside pillar connection structures that are coupled to respective extensions between segments of the gate, drain, and source fingers, with the ground connections interlaced between the input signal connections and between the output signal connections, according to some embodiments of the present disclosure.
Figure 8B:
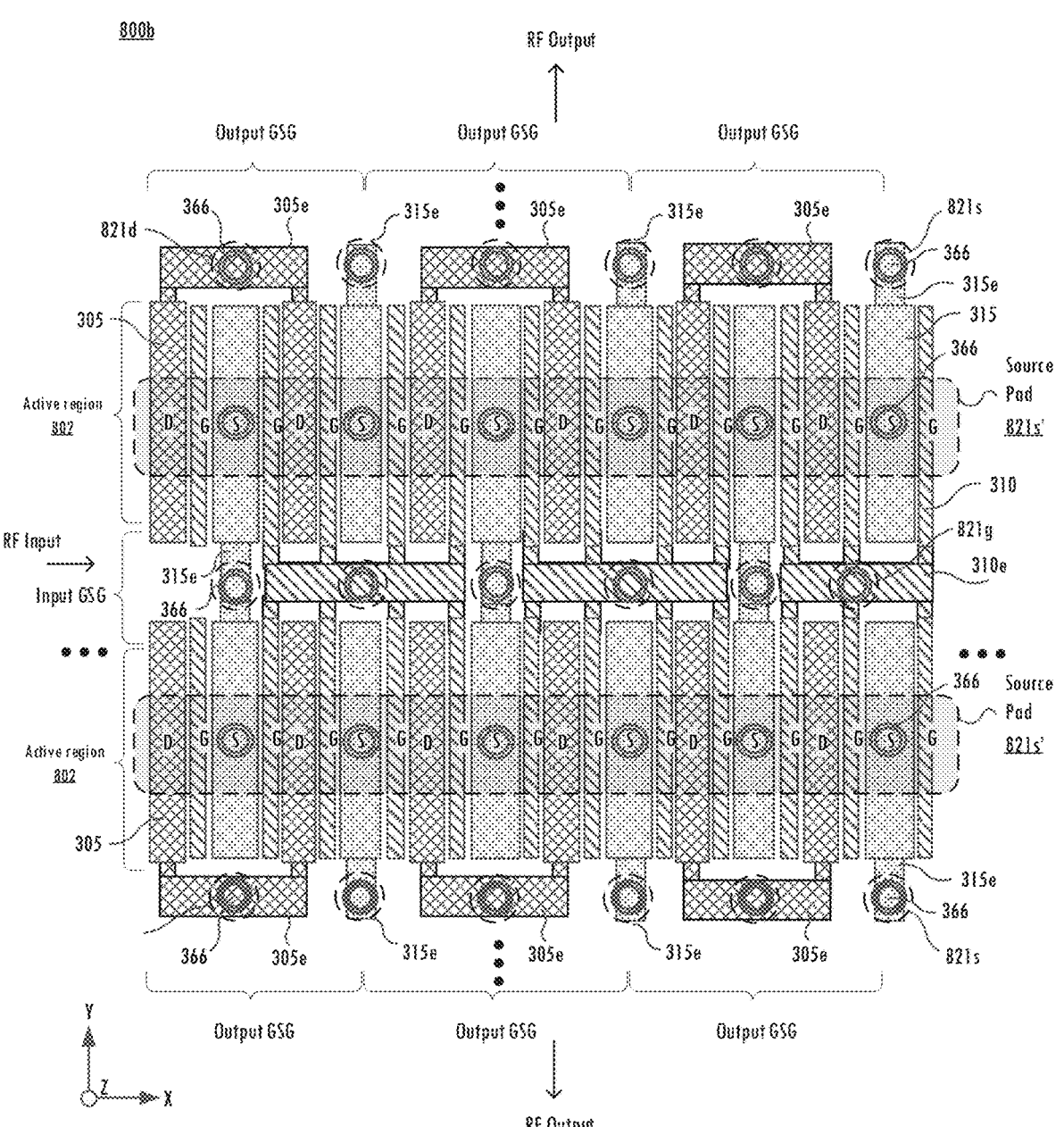

FIGS. 8A and 8B are schematic plan views of RF transistor amplifier dies including arrangements of frontside pillar connection structures that are coupled to respective extensions between segments of the gate, drain, and source fingers, with the ground connections interlaced between the input signal connections and between the output signal connections, according to some embodiments of the present disclosure. As shown in FIGS. 8A and 8B, a transistor die 800a, 800b includes frontside pillars 366 that are coupled to respective segments of the gate fingers G, drain fingers D, and source fingers S (and thus, the gate 310, drain 305, and source 315 contacts) by respective extensions 310e, 305e, and 315e. In FIGS. 8A and 8B, the extensions 310e, 305e, 315e (also referred to as finger extensions or extension regions) are arranged between the segments of the fingers G, D, S. The extensions 310e, 305e, 315e and the frontside pillars 366 connected thereto are aligned with corresponding conductive pad structures on a package substrate (shown in phantom in FIGS. 8A and 8B as connection dots 821g, 821d, and 821s that are spaced apart from one another along the width or X-direction), which in this example are arranged to provide a central input RF signal path or gate feed, with two output RF signal paths at opposing ends or edges of the die 800a, 800b. However, it will be understood that the pattern shown in FIGS. 8A and 8B may be repeated in one or more directions (e.g., along the X- and/or Y-directions). As such, the configuration of the frontside pillars 366 in the transistor die 800a, 800b of FIGS. 8A and 8B may provide respective input signal connections (RF Input) between pairs of output signal connections (RF Output).

The package substrate includes connection dots 821g, 821d, and 821s that are arranged to be aligned with the arrangement of the frontside pillars 366 providing the input, output, and ground connections, respectively. In particular, input (e.g., gate) connection dots 821g may be interlaced between adjacent ground (e.g., source) connection dots 821s between finger segments G, D, S, and output (e.g., drain) connection dots 821d may be interlaced between adjacent ground connection dots 821s at edges of the finger segments G, D, S. As such, input and output GSG configurations may be provided at the gate, drain, and source finger-level, with the respective connection dots 821s, 821d, or 821s coupled to the respective segments of the fingers G, D, or S by the respective frontside pillars 366 and finger extensions 310e, 305e, or 315e. The package substrate may further include electrical connections therein or thereon that electrically connect the input or output connection dots 821g or 821d to route the RF signal into or out of the package, respectively. For example in the illustrated device 800a, 800b of FIGS. 8A and 8B, the package substrate may include conductive traces that combine the RF input signal paths at a central region of the die 800a, 800b, and conductive traces that combine the RF output signal paths at opposing edges of the die 800a, 800b, for RF signal routing into and out of a package, respectively. In the example of FIG. 8B, the package substrate may include additional conductive traces 821s' that combine the ground connections between the input and output signal paths.

In the examples of FIGS. 8A and 8B, subsets of the gate fingers G are coupled to a common frontside pillar 366 by respective gate finger extensions 310e (which are positioned between segments of the gate fingers G) and are electrically isolated from other subsets of the gate fingers G by the interlaced source finger extensions 315e. That is, the individual segments of the fingers G, S, D are separated from one another by the extension regions 310e, 315e providing the input GSG configuration. The ground extension regions 315e may be provided between the input extension regions 310e in a central region of the die 800a, 800b, and between opposing pairs of output extension regions 305e to provide isolation between respective GSG groups defined by the frontside pillars 366. The die 800b of FIG. 8B includes additional frontside pillars 366 coupled to the source fingers S between opposing ends thereof (that is, between the input GSG and the output GSGs), which are aligned with an additional source pad or strap 821s' connection patterns on the package substrate (shown in phantom in FIG. 8B) to provide additional input-to-output isolation, in a manner similar to the source pad 321s discussed above with reference to FIG. 3A.

As in the example of FIGS. 7A and 7B, the input and/or output signal connections may be defined by multiple GSG configurations, with isolation between groups of fingers G or D that carry the input and output signals provided by the frontside pillars 366 and ground extensions 315e coupled to the source fingers S interlaced between the frontside pillars 366 and extensions 310e or 305e in each GSG group. The isolation between subsets of gate fingers G by the intervening frontside pillars 366 and extension regions 315e may allow for higher gate densities in the active region 802. In addition, providing the frontside pillars 366 and extension regions 310e for the input signal connections between segments of the gate fingers G may provide reduced gate resistance Rg, as the signal path between the RF input and the RF output may be shortened (i.e., to the lengths of the respective segments of the gate fingers G) in comparison with the configuration of FIGS. 7A and 7B.

Accordingly, embodiments of the present invention may include any combination of frontside pillars and backside connections where at least one of the input signal, output signal, or ground connections is provided by the frontside pillars. In comparison to the use of wire bond connections to wirebond connection pads (e.g., 310g, 305d), topologies including conductive pillar structures 366 according to embodiments of the present disclosure can shorten the connection paths and/or allow for more complex input/output/ground connection patterns. For example, accessing the input path in the middle of the gate fingers in the active area can significantly lower the gate resistance and improve RF gain Additionally or alternatively, by interlacing the conductive pillar structures 366 providing the input signal connections and/or output signal connections with conductive pillar structures 366 providing grounded strips or dots, additional isolation for input and/or output signal integrity may be achieved. Various arrangements of the conductive pillar structures 366 on the frontside of the die in combination with conductive via structures 368 providing connections to the backside of the die can increase package integration options.

Figure 9A:
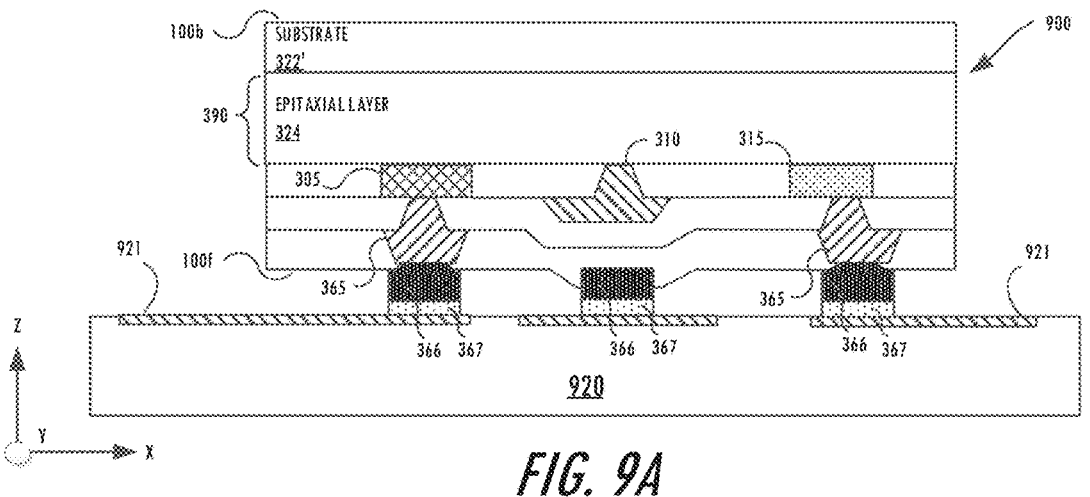
FIGS. 9A and 9B are cross-sectional and plan views, respectively, illustrating examples of attachment of RF transistor amplifier dies to a package substrate using frontside pillar connection structures according to some embodiments of the present disclosure.
Figure 9B:
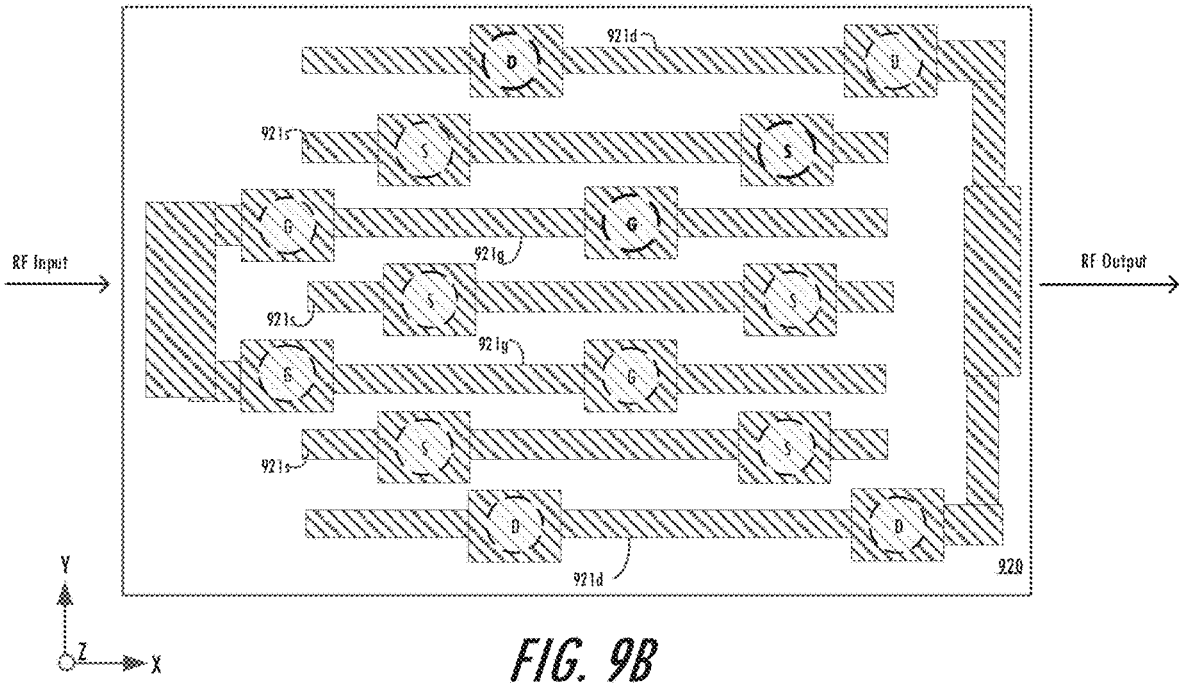

FIGS. 9A and 9B are cross-sectional and plan views, respectively, illustrating examples of substrate attachment of RF transistor amplifier dies with frontside pillar connection structures according to some embodiments of the present disclosure. Referring to FIG. 9A, a transistor die 900 including conductive frontside pillar structures 366 according to any of the previous embodiments may be mounted on a package substrate 920 to provide off-chip electrical connections, in some embodiments free of wirebond connection pads.

Figure 10:
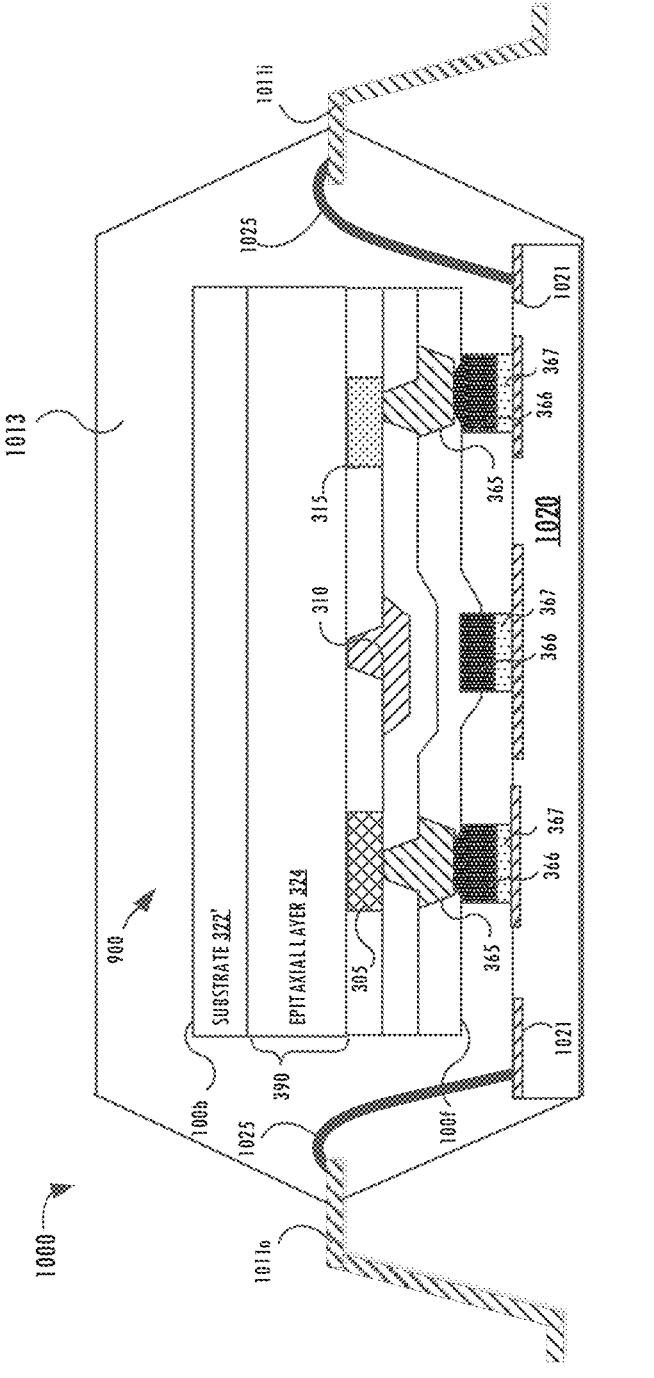
FIGS. 10, 11, and 12 are cross-sectional views illustrating examples of device packages including RF transistor amplifier dies with frontside pillar connection structures according to some embodiments of the present disclosure.
Figure 11:
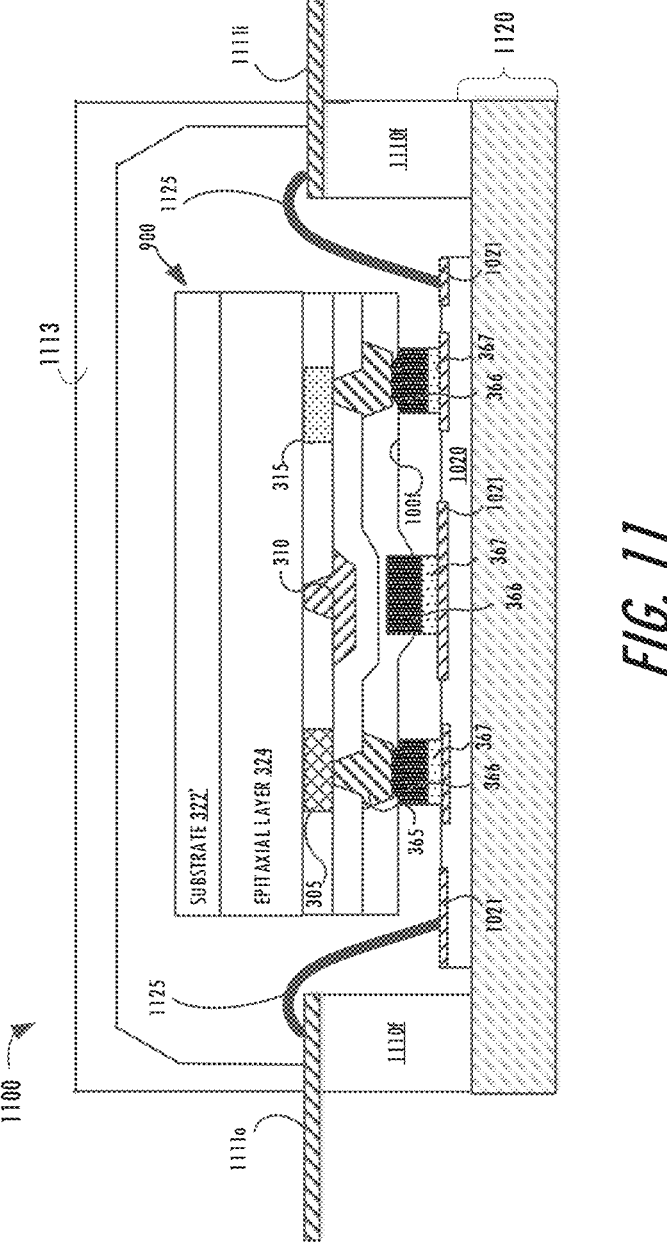
Figure 12:
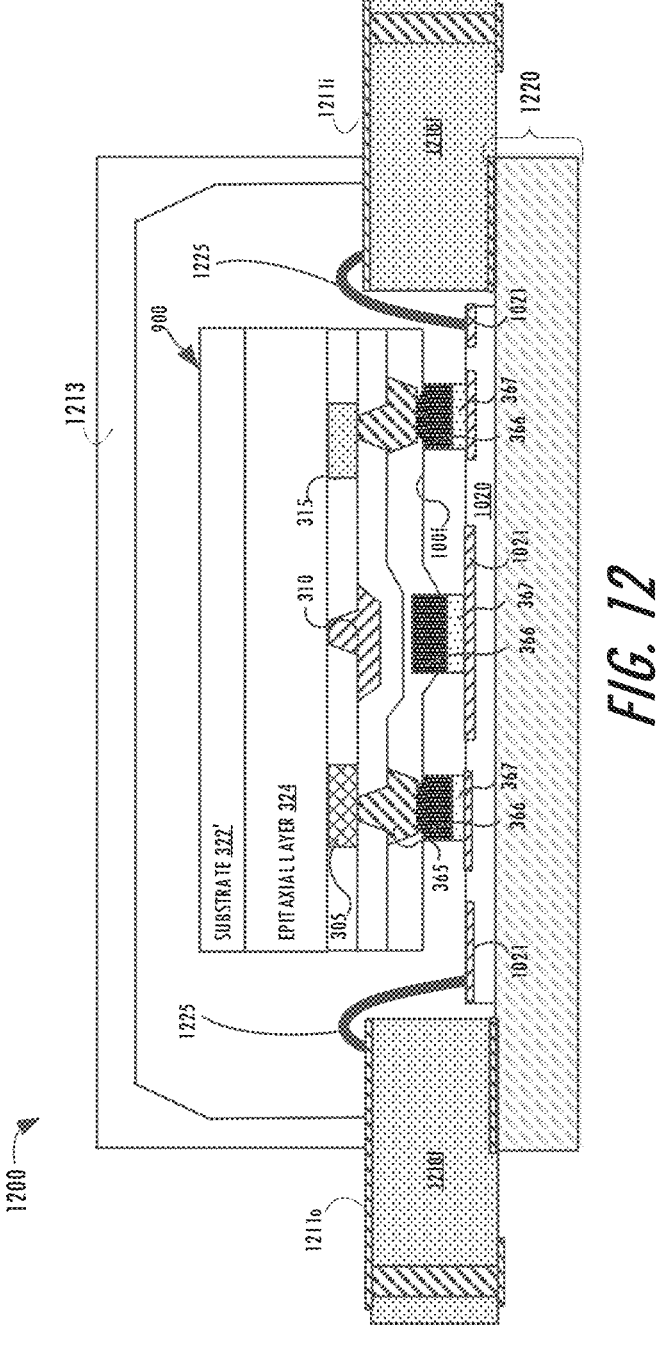

In particular, as shown in FIG. 9A, the die 900 is "flipped" with the frontside 100f facing the surface of the package substrate 920, such that the frontside pillars 366 physically attach the die 900 to the package substrate 920, and electrically connect the transistor cells to corresponding conductive connection patterns (shown as conductive traces 921) on the package substrate 920 (e.g., by the solder layers 367) to provide input signal, output signal, or ground connections for electrical signal routing into and out of a device package (examples of which are shown in FIGS. 10-12). In some embodiments, the package substrate may include a thermally conductive heat sink (e.g., a conductive flange of a thermally-enhanced package) for both electrical signal routing (e.g., coupling to an electrical ground) and heat transfer through the substrate (examples of which are shown in FIGS. 11-12).

Referring to FIG. 9B, the package substrate 920 includes conductive connection patterns or traces 921 corresponding to an arrangement of the conductive pillar structures 366 on the die 900 to provide the input signal, output signal, and/or ground connections.

For example, the package substrate 920 may be, a PCB or RDL structure, and the conductive patterns or traces 921 may combine the RF input signal paths, and conductive traces that combine the RF output signal paths for routing into and out of a package. By way of example, the routing of the conductive patterns or traces shown in FIG. 9B implement interdigitated connection strips 921g, 921d, 921s that provide respective input and output GSG configurations. However, it will be understood that package substrates according to embodiments of the present disclosure may include conductive connection patterns therein or thereon corresponding to any arrangements of conductive pillar structures, including but not limited to those described herein.

FIG. 10 is a cross-sectional view illustrating an example of an over mold-type integrated circuit device package including an RF transistor amplifier die 900 in accordance with some embodiments of the present disclosure. As shown in FIG. 10, the package 1000 includes a device 900 having components and connections similar to any of the embodiments described herein, which are flipped and mounted by the frontside pillars 366 and die attach material layers (e.g., solder layers 367) to respective conductive traces 1021 on a substrate 1020, such as a PCB or RDL structure. In the example of FIG. 10, an over mold-type packaging material 1013 substantially surrounds or encapsulates the device 100, while providing access to package leads (e.g., gate and drain leads) 1011i, 10110 (collectively 1011) via wire bond connections 1025 for connection to circuits or devices that are external to the package 1000. The over-mold 1013 may be formed of a plastic or a plastic polymer compound, thereby providing protection from the outside environment. Some advantages of the over mold type packaging material 1013 include reduced overall height or thickness of the package 1000, and design flexibility for the arrangement of and/or spacing between the leads 1011.

In particular, in the example of FIG. 10, an input lead 1011i is coupled to the gate 310 by a wirebond 1025, conductive traces 1021 on the package substrate 1020, and the corresponding frontside pillars 366; the output lead 10110 is coupled to the drain 305 by a wirebond 1025, conductive traces 1021 on the package substrate 1020, and the corresponding frontside pillars 366; and the source 315 is grounded through conductive traces 1021 on the package substrate 1020 and the corresponding frontside pillar 366.

FIGS. 11 and 12 are cross-sectional views illustrating examples of thermally enhanced integrated circuit device packages including an RF transistor amplifier die 100 in accordance with some embodiments of the present disclosure. As shown in FIGS. 11 and 12, the open-cavity packages 1100, 1200 include devices 900 having components and connections similar to any of the embodiments described herein, but mounted on a conductive base or flange 1120, 1220 and protected by a lid member 1113, 1213 of thermally enhanced packages. In particular, FIG. 11 illustrates a first implementation (which may be referred to as a TEPAC package 1100) and FIG. 12 illustrates a second implementation (which may be referred to as a T3PAC package 1200) of thermally enhanced packages in accordance with embodiments of the present disclosure. In some embodiments, the flange 1120, 1220 may provide both an attachment surface for the die 900 and PCB or RDL structure 1020 (and/or other components of the package) as well as thermal conductivity (e.g., a heat sink) for dissipating or otherwise transmitting heat generated by the components to the outside of the package 1100, 1200. The flange 1120, 1220 may also provide one of the terminals for the package 1100, 1200. For example, the flange 1120, 1220 may be configured to provide an electrical ground connection.

The TEPAC package 1100 of FIG. 11 may be a ceramic-based package that includes an upper housing defined by a lid member 1113 and a frame member (shown in cross-section as sidewalls 1110f). The lid member 1113 and/or sidewalls 1110f may include ceramic materials (e.g., alumina) and may define an open cavity surrounding the die 100 on the conductive base or flange 1120. The lid member 1113 may be glued to the sidewalls 1110f using an epoxy glue. The sidewalls 1110f may be attached to the base 1120 via brazing.

The T3PAC package 1200 of FIG. 12 may also be a ceramic-based package that includes a base 1220 and an upper housing with a lid member 1213 and a frame member (shown in cross-section as sidewalls 1210f). The lid member 1213 and sidewalls 1210f similarly define an open cavity surrounding the die 100 on the conductive base or flange 1220. In the package 1200, the lid member 1213 may be a ceramic material (e.g., alumina), while the sidewalls 1210f may be a printed circuit board (PCB).

In FIGS. 11 and 12, the flange 1120, 1220 may be an electrically conductive material, for example, a copper layer/laminate or an alloy or metal-matrix composite thereof. In some embodiments, the flange 1120 may include a copper-molybdenum (CuMo) layer, CPC (Cu/MoCu/Cu), or other copper alloys, such copper-tungsten CuW, and/or other laminate/multi-layer structures. In the example of FIG. 11, the flange 1120 may be a CPC-based structure to which the sidewalls 1110f and/or lid member 1113 are attached. In the example of FIG. 12, the flange 1220 may be a copper-molybdenum (RCM60)-based structure to which the sidewalls 1210f and/or lid member 1213 are attached, e.g., by a conductive glue.

In FIGS. 11 and 12, one of the terminals of the die 900 (e.g., a source contact 315) may be attached to the flange 1120, 1220, and the flange 1120, 1220 may thus provide the source lead for the package 1100, 1200. Conductive leads 1111, 1211 may provide gate and drain leads of the package

1100, and are attached to the flange 1120, 1220 and supported by the respective sidewalls 1110f, 1210f. In the examples of FIGS. 11 and 12, respective wire bonds 1125, 1225 are thus used to connect the package leads 1111, 1211 to the die 900 for connection to circuits or devices that are external to the package 1100, 1200. The wire bonds 1125, 1225 may be omitted in other embodiments and different electrical connections may be used. More generally, the packages 1000, 1100, 1200 described herein may include any combination of conductive vias, wirebonds, and/or conductive pillars to electrically connect the terminals 310, 305, 315 to input, output, and/or ground leads of the packages.

In the figures, the conductive pillars 366 are illustrated as free-standing, without encapsulation by other non-conductive materials. Such free-standing pillars 366 may provide benefits, including but not limited to reduced RF parasitic coupling, e.g., pillar-to-pillar, chip-to-chip/board and/or pillar-to-chip/board. However, it will be understood that any of the embodiments having conductive pillars 366 as described herein may further include an encapsulant material, such as an overmold, on or covering the pillars 366 between the insulating layers 350, 355, 360 and the attachment substrate, to provide additional protection (mechanical, humidity, etc.) and/or support for the pillars 366. In some embodiments, whether the pillars 366 are free-standing or supported by an encapsulant material may vary based on design elements (e.g., power, frequency, matching circuitry, packaging, etc.).

Embodiments of the present disclosure can be assembled on substrate or laminate (e.g., a RDL laminate), and assembled in batches using modern enhanced wafer level packaging techniques. The die may include transistor cells of a power transistor device, e.g., defining an RF power amplifier. In some embodiments, the die may include discrete multi-stage, and monolithic microwave integrated circuit (MMIC), and/or multi-path (e.g., Doherty) transistor devices.

While described primarily with reference to HEMT transistor structures, it will be understood that fabrication processes and transistor structures in accordance embodiments of the present disclosure are not so limited. For example, the devices and fabrication methods described herein may be applied to other transistor structures, including but not limited to vertical or lateral MOSFET structures, with the gate contact 310 separated by from the surface of the epitaxial layer 324 by an oxide or other insulating layer. In a device having a lateral structure, the terminals of the device (e.g., the drain, gate and source terminals for a power MOSFET device) are on the same major surface (i.e., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). Vertical power semiconductor devices that include a MOSFET transistor can have a standard gate electrode design in which the gate electrode of the transistor is formed on top of the semiconductor layer structure or, alternatively, may have the gate electrode buried in a trench within the semiconductor layer structure, typically referred to as gate trench MOSFETs.

Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications. Embodiments of the present disclosure may also be applied to radar and MMIC-type applications. More generally, embodiments of the present disclosure may be applied in GaN HEMT discrete and RF IC technologies, as well as in power MOSFET, Schottky, or any devices that may use wire bonds for external connections.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items. The term "at least one of" likewise includes any and all combinations of one or more of the associated listed items, but may not require one of each of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on," "attached," or extending "onto" another element, it can be directly on the other element or intervening elements may also be present. In contrast, when an element is referred to as being "directly on" or "directly attached" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A radio frequency ("RF") transistor amplifier die, comprising:
   a semiconductor layer structure including an active region comprising a plurality of transistor cells, wherein the transistor cells comprise gate fingers extending on the active region of the semiconductor layer structure;
   an insulating layer on a surface of the semiconductor layer structure; and
   a plurality of conductive pillar structures that protrude from a surface of the insulating layer opposite the surface of the semiconductor layer structure,
   wherein a first subset of the conductive pillar structures is configured to provide ground connections to the transistor cells, a second subset of the conductive pillar structures is configured to provide input signal connections to the transistor cells, and respective conductive pillar structures of the second subset are arranged in the active region, are coupled to the gate fingers between opposing ends thereof by one or more intervening metal layers thereon, and are configured to be attached to at least one device that is external to the RF transistor amplifier die.

2. The RF transistor amplifier die of claim 1, wherein a third subset of the conductive pillar structures is configured to provide output signal connections to the transistor cells, and respective conductive pillar structures of the first subset are arranged between the respective conductive pillar structures of the second and third subsets that are configured to provide the input signal and output signal connections, respectively.

3. The RF transistor amplifier die of claim 1, wherein the respective conductive pillar structures of the second subset are arranged between respective conductive pillar structures of the first subset.

4. The RF transistor amplifier die of claim 3, wherein a third subset of the conductive pillar structures is configured to provide output signal connections to the transistor cells, and respective conductive pillar structures of the third subset are arranged between respective conductive pillar structures of the first subset.

5. The RF transistor amplifier die of claim 3, wherein the transistor cells comprise drain and source fingers extending on the semiconductor layer structure, wherein a third subset of the conductive pillar structures is configured to provide output signal connections to the transistor cells, wherein the respective conductive pillar structures of the first subset are coupled to the source fingers, and the respective conductive pillar structures of the third subset are on the drain fingers.

6. The RF transistor amplifier die of claim 5, wherein the respective conductive pillar structures of the second subset are between opposing ends of the gate fingers.

7. The RF transistor amplifier die of claim 5, wherein the respective conductive pillar structures of the first subset are coupled to respective extension regions of the source fingers, and the respective conductive pillar structures of the second subset are coupled to respective extension regions of the gate fingers.

8. The RF transistor amplifier die of claim 7, wherein the gate, drain, and/or source fingers respectively comprise finger segments that are spaced apart from each other, and wherein the respective extension regions are arranged between the finger segments.

9. The RF transistor amplifier die of claim 1, wherein the transistor cells comprise drain and source fingers extending on the semiconductor layer structure, and wherein the input signal connections provided by the respective conductive pillar structures of the second subset are free of wirebond connection pads that electrically connect to the gate fingers.

10. The RF transistor amplifier die of claim 9, wherein at least one of the respective conductive pillar structures of the second subset is coupled to multiple of the gate fingers by the one or more intervening metal layers thereon.

11. The RF transistor amplifier die of claim 1, wherein conductive pillar structures protrude from the insulating layer adjacent a top of the RF transistor amplifier die, and further comprising:

a substrate on the semiconductor layer structure opposite the surface having the insulating layer thereon; and conductive via structures that extend through the substrate, wherein the conductive via structures are configured to provide at least one of other input signal, output signal, and ground connections to the transistor cells, respectively.

12. The RF transistor amplifier die of claim 1, wherein the conductive pillar structures of the first and third subsets are arranged within an active region comprising the transistor cells to provide the ground and output signal connections, respectively.

13. The RF transistor amplifier die of claim 1, wherein the respective conductive pillar structures of the second subset and the one or more intervening metal layers between the respective conductive pillar structures of the second subset and the gate fingers are wider than the gate fingers.

14. A radio frequency ("RF") transistor amplifier die, comprising:

a semiconductor layer structure including an active region comprising a plurality of transistor cells;

an insulating layer on a surface of the semiconductor layer structure; and a plurality of conductive pillar structures that protrude from a surface of the insulating layer opposite the surface of the semiconductor layer structure, wherein a first subset of the plurality of conductive pillar structures is configured to provide input signal connections to the transistor cells, wherein the transistor cells comprise gate fingers extending on the active region of the semiconductor layer structure, and wherein respective conductive pillar structures of the first subset are arranged in the active region, are coupled to the gate fingers between opposing ends thereof by one or more intervening metal layers thereon, and are configured to be attached to at least one device that is external to the RF transistor amplifier die.

15. The RF transistor amplifier die of claim 14, wherein a second subset and a third subset of the plurality of conductive pillar structures are configured to provide ground connections and output signal connections to the transistor cells, respectively, and respective conductive pillar structures of the second subset are arranged between respective conductive pillar structures of the first subset and respective conductive pillar structures of the third subset.

16. The RF transistor amplifier die of claim 14, wherein a second subset of the plurality of conductive pillar structures is configured to provide ground connections to the transistor cells, and respective conductive pillar structures of the first subset are arranged between respective conductive pillar structures of the second subset.

17. The RF transistor amplifier die of claim 16, wherein a third subset of the plurality of conductive pillar structures is configured to provide output signal connections to the transistor cells, and respective conductive pillar structures of the third subset are arranged between respective conductive pillar structures of the second subset.

18. The RF transistor amplifier die of claim 17, wherein the transistor cells further comprise source and drain fingers extending on the semiconductor layer structure, wherein the respective conductive pillar structures of the second subset are between opposing ends of the source fingers, and/or the respective conductive pillar structures of the third subset are between opposing ends of the drain fingers.

19. A radio frequency ("RF") transistor amplifier die, comprising:

a semiconductor layer structure including an active region comprising a plurality of transistor cells adjacent a surface thereof; and a plurality of conductive pillar structures that protrude away from the surface of the semiconductor layer structure, wherein a first subset of the plurality of conductive pillar structures are configured to provide input signal connections to the transistor cells, wherein the transistor cells comprise gate, drain, and source fingers extending on the active region of the semiconductor layer structure, and wherein respective conductive pillar structures of the first subset are arranged in the active region, are coupled to the gate fingers by one or more intervening metal layers thereon, and are configured to be attached to at least one device that is external to the RF transistor amplifier die and provide the input signal connections free of connecting buses that electrically connect the gate fingers.

20. The RF transistor amplifier die of claim 19, wherein respective conductive pillar structures of a second subset of the plurality of conductive pillar structures are coupled to the source fingers between opposing ends thereof, the respective conductive pillar structures of the first subset are coupled to the gate fingers between opposing ends thereof, and/or respective conductive pillar structures of a third subset of the plurality of conductive pillar structures are coupled to the drain fingers between opposing ends thereof.

21. The RF transistor amplifier die of claim 19, wherein a second subset and a third subset of the plurality of conductive pillar structures are configured to provide ground connections and output signal connections to the transistor cells, respectively, and respective conductive pillar structures of the second subset are arranged between respective conductive pillar structures of the first and/or third subsets.

22. The RF transistor amplifier die of claim 21, wherein the respective conductive pillar structures of the second subset that are configured to provide the ground connections are arranged between the respective conductive pillar structures of the first subset and the respective conductive pillar structures of the third subset that are configured to provide the input signal and output signal connections, respectively.

23. An integrated circuit device package, comprising:
a radio frequency ("RF") transistor amplifier die comprising a semiconductor layer structure including an active region comprising a plurality of transistor cells, an insulating layer on a surface of the semiconductor layer structure, and a plurality of conductive pillar structures that protrude from a surface of the insulating layer opposite the surface of the semiconductor layer structure; and
a package substrate comprising conductive connection patterns corresponding to an arrangement of the conductive pillar structures, wherein the conductive pillar structures attach the RF transistor amplifier die to the conductive connection patterns of the package substrate, which are external to the RF transistor amplifier die, and are configured to provide at least one of input signal, output signal, and ground connections to the transistor cells, wherein the transistor cells comprise gate fingers extending on the active region of the semiconductor layer structure, a first subset of the conductive pillar structures are configured to provide the input signal connections, and respective conductive pillars of the first subset are arranged in the active region and are coupled to the gate fingers between opposing ends thereof by one or more intervening metal layers thereon.

24. The integrated circuit device package of claim 23, wherein the conductive pillar structures protrude from the insulating layer adjacent a top of the RF transistor amplifier die, and wherein the RF transistor amplifier die further comprises:
a substrate on the semiconductor layer structure opposite the surface having the insulating layer thereon; and
conductive via structures that extend through the substrate, wherein the conductive via structures are configured to provide at least one of other input signal, output signal, or ground connections to the transistor cells, respectively.

25. The integrated circuit device package of claim 23, wherein the input signal connections provided by the conductive pillar structures are free of wirebond connection pads that electrically connect to the gate fingers of the transistor cells.

26. The integrated circuit device package of claim 23, wherein the semiconductor layer structure comprises one or more epitaxial layers of a wide bandgap semiconductor material.

27. The integrated circuit device package of claim 23, wherein the semiconductor layer structure comprises a Group-III nitride material on a silicon carbide substrate.

* * * * *